(12) United States Patent
Guo et al.

(10) Patent No.: US 10,748,873 B2
(45) Date of Patent: Aug. 18, 2020

(54) SUBSTRATES, ASSEMBLES, AND TECHNIQUES TO ENABLE MULTI-CHIP FLIP CHIP PACKAGES

(71) Applicant: Intel Corporation, Santa Clara, CA (US)

(72) Inventors: Mao Guo, Shanghai (CN); Min-Tih Lai, Orangevale, CA (US); Tyler Charles Leuten, Orangevale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,219

(22) PCT Filed: Sep. 23, 2015

(86) PCT No.: PCT/CN2015/090463
§ 371 (c)(1),
(2) Date: Feb. 26, 2018

(87) PCT Pub. No.: WO2017/049510
PCT Pub. Date: Mar. 30, 2017

(65) Prior Publication Data
US 2018/0204821 A1    Jul. 19, 2018

(51) Int. Cl.
*H01L 25/065*    (2006.01)
*H01L 23/498*    (2006.01)
(Continued)

(52) U.S. Cl.
CPC ........ *H01L 25/0657* (2013.01); *H01L 21/481* (2013.01); *H01L 23/13* (2013.01);
(Continued)

(58) Field of Classification Search
CPC ... H01L 25/0657; H01L 25/074; H01L 25/117
See application file for complete search history.

(56) References Cited

U.S. PATENT DOCUMENTS 6,492,726 B1    12/2002    Quek et al.
8,643,164 B2    2/2014    Kaufmann et al.
(Continued)

FOREIGN PATENT DOCUMENTS

| CN | 101288350 A | 10/2008 |
|---|---|---|
| CN | 103165505 B | 5/2017 |
| WO | 2017049510 A1 | 3/2017 |

OTHER PUBLICATIONS

International Search Report and Written Opinion in International Patent Application No. PCT/CN2015/090463 dated Jun. 23, 2016, 11 pages.

*Primary Examiner* — Mark V Prenty
(74) *Attorney, Agent, or Firm* — Patent Capital Group

(57) ABSTRACT

Substrates, assemblies, and techniques for enabling multi-chip flip chip packages are disclosed herein. For example, in some embodiments, a package substrate may include a first side face; a second side face, wherein the second side face is opposite to the first side face along an axis; a portion of insulating material extending from the first side face to the second side face; wherein a cross-section of the portion of insulating material taken perpendicular to the axis has a stairstep profile. Solder pads may be disposed at base and step surfaces of the portion of insulating material. One or more dies may be coupled to the package substrate (e.g., to form a multi-chip flip chip package), and in some embodiments, additional IC packages may be coupled to the package substrate. In some embodiments, the package substrate may be reciprocally symmetric or approximately reciprocally symmetric.

25 Claims, 13 Drawing Sheets

(51) Int. Cl.

| | | |
|---|---|---|
| *H01L 23/538* | (2006.01) | |
| *H01L 23/00* | (2006.01) | |
| *H01L 23/13* | (2006.01) | |
| *H05K 3/46* | (2006.01) | |
| *H01L 21/48* | (2006.01) | |
| *H01L 25/00* | (2006.01) | |
| *H01L 23/31* | (2006.01) | |

(52) U.S. Cl.
CPC .... *H01L 23/49816* (2013.01); *H01L 23/5384* (2013.01); *H01L 24/16* (2013.01); *H01L 24/29* (2013.01); *H01L 24/32* (2013.01); *H01L 24/33* (2013.01); *H01L 24/73* (2013.01); *H01L 24/81* (2013.01); *H01L 24/83* (2013.01); *H01L 24/85* (2013.01); *H01L 24/92* (2013.01); *H01L 25/50* (2013.01); *H05K 3/46* (2013.01); *H01L 23/3128* (2013.01); *H01L 24/13* (2013.01); *H01L 24/48* (2013.01); *H01L 2224/13101* (2013.01); *H01L 2224/16225* (2013.01); *H01L 2224/16227* (2013.01); *H01L 2224/16235* (2013.01); *H01L 2224/29034* (2013.01); *H01L 2224/32145* (2013.01); *H01L 2224/32227* (2013.01); *H01L 2224/33181* (2013.01); *H01L 2224/45015* (2013.01); *H01L 2224/48091* (2013.01); *H01L 2224/48145* (2013.01); *H01L 2224/73203* (2013.01); *H01L 2224/73215* (2013.01); *H01L 2224/73253* (2013.01); *H01L 2224/73265* (2013.01); *H01L 2224/81192* (2013.01); *H01L 2224/83101* (2013.01); *H01L 2225/0651* (2013.01); *H01L 2225/06506* (2013.01); *H01L 2225/06517* (2013.01); *H01L 2225/06548* (2013.01); *H01L 2225/06562* (2013.01); *H01L 2225/06572* (2013.01); *H01L 2924/00014* (2013.01); *H01L 2924/14* (2013.01); *H01L 2924/1436* (2013.01); *H01L 2924/15153* (2013.01); *H01L 2924/15156* (2013.01); *H01L 2924/15159* (2013.01); *H01L 2924/15311* (2013.01); *H01L 2924/181* (2013.01)

(56) References Cited

U.S. PATENT DOCUMENTS

| | | | |
|---|---|---|---|
| 9,202,716 B2* | 12/2015 | Park | H01L 24/96 |
| 10,049,953 B2* | 8/2018 | Yu | H01L 24/20 |
| 2013/0147063 A1 | 6/2013 | Park et al. | |
| 2018/0204821 A1* | 7/2018 | Guo | H01L 23/13 |

* cited by examiner

```
                                    3100
                                        ↙

┌─────────────────────────────────┐
        │ Provide an IC substrate,        │
        │ including: a first side face, a │
        │ second side face opposite to    │
        │ the first side face along an    │
        │ axis, and a portion of          │
        │ insulating material extending   │
        │ from the first side face to the │
        │ second side face, wherein a     │
        │ cross-section of the portion of │
        │ insulating material taken       │
        │ perpendicular to the axis has a │
        │ stairstep profile and includes  │
        │ at least a base surface and a   │
        │ step surface                    │
        │              3102               │
        └─────────────────────────────────┘
                        │
                        ▼
        ┌─────────────────────────────────┐
        │ Couple a first die to the base  │
        │ surface                         │
        │              3104               │
        └─────────────────────────────────┘
                        │
                        ▼
        ┌─────────────────────────────────┐
        │ Couple a second die to the      │
        │ step surface                    │
        │              3106               │
        └─────────────────────────────────┘

FIG. 31
```

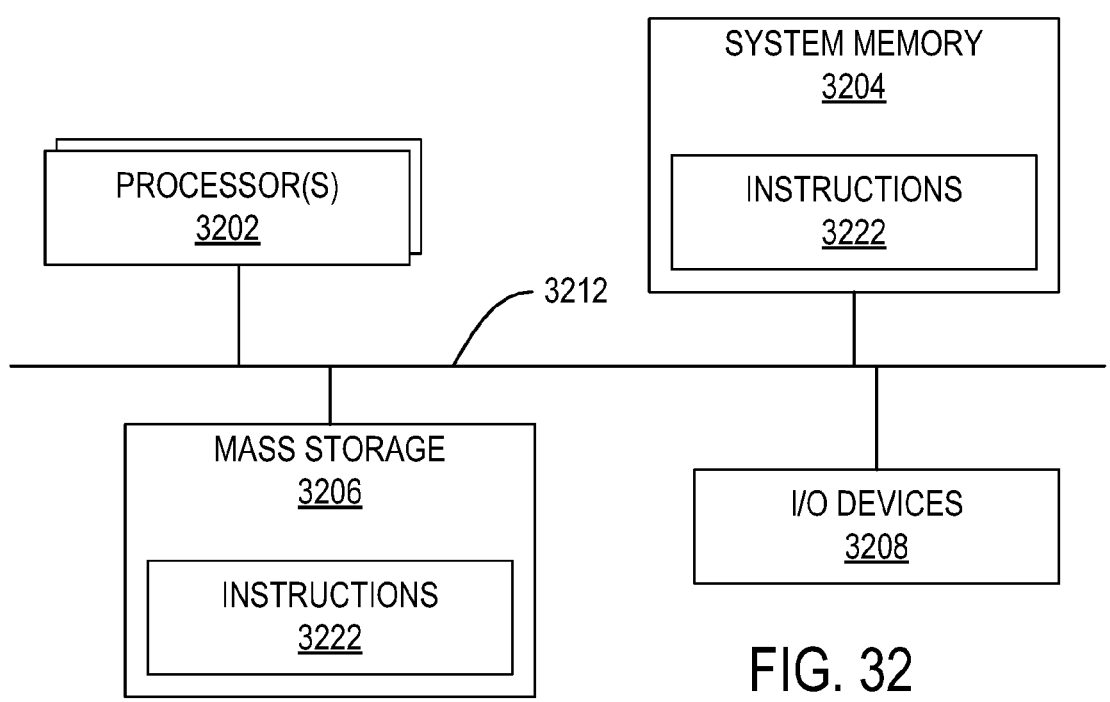

FIG. 32

SUBSTRATES, ASSEMBLES, AND TECHNIQUES TO ENABLE MULTI-CHIP FLIP CHIP PACKAGES

CROSS-REFERENCE TO RELATED APPLICATION

This application is a national stage application under 35 U.S.C. § 371 of PCT Application PCT/CN2015/090463, filed Sep. 23, 2015 and entitled "SUBSTRATES, ASSEMBLES, AND TECHNIQUES TO ENABLE MULTI-CHIP FLIP CHIP PACKAGES," which is hereby incorporated by reference in its entirety.

TECHNICAL FIELD

The present disclosure relates generally to the field of integrated circuits, and more particularly, to substrates, assemblies, and techniques to enable multi-chip flip chip packages.

BACKGROUND

To increase the density of dies in an integrated circuit (IC) package of a particular footprint, dies may be stacked on top of each other and wire-bonded together. The dies may be coupled to an underlying flat substrate via additional wire bonds, and the substrate may be soldered or otherwise connected to other devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 31 is a flow diagram of a method of manufacturing an IC assembly, in accordance with various embodiments.

FIG. 32 is a block diagram of an example computing device that may include or be included in an IC assembly having a stairstep and/or reciprocally symmetric substrate, in accordance with any of the embodiments disclosed herein.

DETAILED DESCRIPTION

Figure 1:
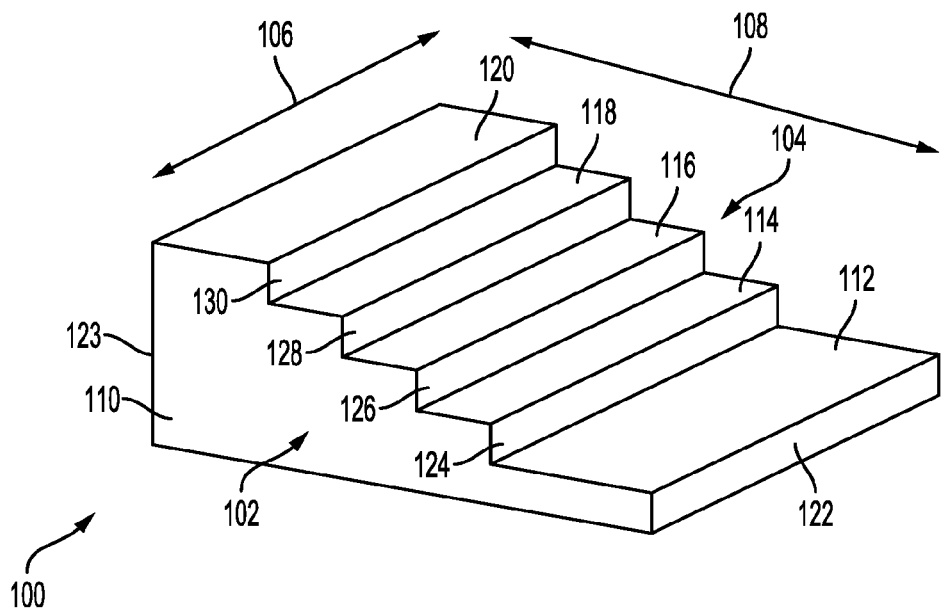
FIG. 1 is a perspective view of a package substrate having a stairstep profile, in accordance with various embodiments.

Disclosed herein are substrates, assemblies, and techniques for enabling multi-chip flip chip packages. In some embodiments, a package substrate may have a stairstep profile when viewed in cross-section, and one or more dies may be coupled to the step surfaces of the package substrate to form a multi-chip flip chip IC package. Additional dies may be wire-bonded to such an IC package, and multiple such IC packages may be stacked to form a package-on-package (PoP) structure. Manufacturing techniques are disclosed herein to achieve material efficiency when a package substrate is reciprocally symmetric or approximately reciprocally symmetric.

As noted above, conventional approaches to increasing the density of dies in an electronic device have relied on wire-bonding dies to each other and to a substrate. These approaches, including multichip and stacked die array techniques, utilize a flat substrate with at least two metal layers. The substrate provides a physical base for the dies and also provides electrical routing of power, ground, and intelligence.

These conventional wire-bond approaches may have limited electrical performance relative to other bond technologies, and thus may not be suitable for the demands of next-generation electronic devices. For example, wires are typically thin (e.g., with a diameter less than 1 mil) and can be long (e.g., over 40 mils), relative to the "fatter" and "shorter" solder bumps used for flip chip (FC) connections (e.g., on the order of 4 mils wide and less than 8 mils tall). The resistance and inductance of a wire is thus typically higher than that of a solder bump, which impacts signal quality and limits current carrying capacity. Alternative approaches, such as flip chip ball grid array (FC BGA) packaging, may have improved electrical performance but has conventionally been limited to including only one chip in each package. This limitation effectively precludes the use of conventional FC BGA techniques, such as chip scale packaging (CSP), in high-density products. Previous attempts to combine wire-bond and FC BGA techniques (e.g., by stacking a conventional wire-bond package on a conventional FC BGA package) have incurred a substantial increase in the complexity of manufacturing, assembly throughput time, and cost. Moreover, such previous attempts have often resulted in structures that are too "tall" for application in smaller form-factor devices (e.g., smartphones and wearables).

Various ones of the embodiments disclosed herein may allow for the vertical stacking of multiple dies without requiring the use of wire bonds. Instead, a novel stairstep substrate structure may be bonded to multiple dies using FC techniques (e.g., a solder pad/solder ball connection) at the step surfaces. Conductive pathways within the substrate may provide paths for power, ground, and data transmission to and from the dies.

Also disclosed herein are novel manufacturing techniques for forming package substrates that are reciprocally symmetric or approximately reciprocally symmetric. These techniques enable multiple package substrates having stairstep profiles (or other suitable profiles) to be formed in a single "block" of material and separated toward the end of the manufacturing process. These techniques may improve material efficiency dramatically compared with traditional techniques by utilizing the material that would ordinarily be "waste" to form another package substrate. In particular, for stairstep structures, two reciprocally symmetric or approximately reciprocally symmetric structures can be built from a single block of substrate material with little to no waste. Although the stairstep structures disclosed herein may be formed using conventional techniques (e.g., by routing or otherwise removing and discarding the substrate material that is not part of the final substrate), the novel techniques disclosed herein may be advantageously efficient in material usage.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, the terms "chip" and "die" may be used interchangeably.

FIG. 1 is a perspective view of a package substrate 100 having a stairstep profile, in accordance with various embodiments. The package substrate 100 may have a first side face 102 and a second side face 104. The second side face 104 may be opposite to the first side face 102 along a first axis 106. A portion of insulating material 110 may extend from the first side face 102 to the second side face 104. The insulating material 110 may be any suitable insulating material for providing a substrate for an circuit board or package, such as a dielectric material. For example, in some embodiments, the insulating material 110 may include bismaleimide-triazine (BT) resin with a glass fiber reinforcement material and fillers. A particular example that may be used in suitable applications includes dielectric material from the HL832 series manufactured by Mitsubishi Gas Chemical (Tokyo, Japan), or similar materials.

A cross-section of the portion of insulating material 110, taken perpendicular to the first axis 106, may have a stairstep profile. As used herein, a structure may have a "stairstep profile" when the structure has a cross-section having a pattern suggestive of the steps of a staircase. In particular, a stairstep profile may include a base surface (corresponding to the surface on which a staircase is located) and at least one step surface (corresponding to the at least one surface onto which a user steps when using a staircase). Note that the identification of a "base surface" in a stairstep profile may be relative; for example, a step surface 114 may be identified as the base surface from which step surfaces 116, 118, and 120 rise. In particular, any step surface in a stairstep profile may be identified as a base surface as long as there is an additional step surface "above it." In some embodiments, a stairstep profile may include a base surface and a single step surface (corresponding to a staircase with a single step). In other embodiments, a stairstep profile may include a base surface and multiple step surfaces. This step surface in a stairstep profile that is "farthest" from the base surface may be referred to herein as a "top step surface." In an embodiment where a stairstep profile includes a single step surface, the single step surface may be the "top step surface." In embodiments where the stairstep profile includes multiple step surfaces, the step surface(s) that is (are) not the top step surface may be referred to herein as "intermediate step surface(s)."

For example, FIG. 1 illustrates an embodiment having a base surface 112, a top step surface 120, and intermediate step surfaces 114, 116, and 118. A rise 124 may be disposed between the base surface 112 and the step surface 114, a rise 126 may be disposed between the step surface 114 and the step surface 116, a rise 128 may be disposed between the step surface 116 and the step surface 118, and a rise 130 may be disposed between the step surface 118 and the step surface 120.

Figure 2:
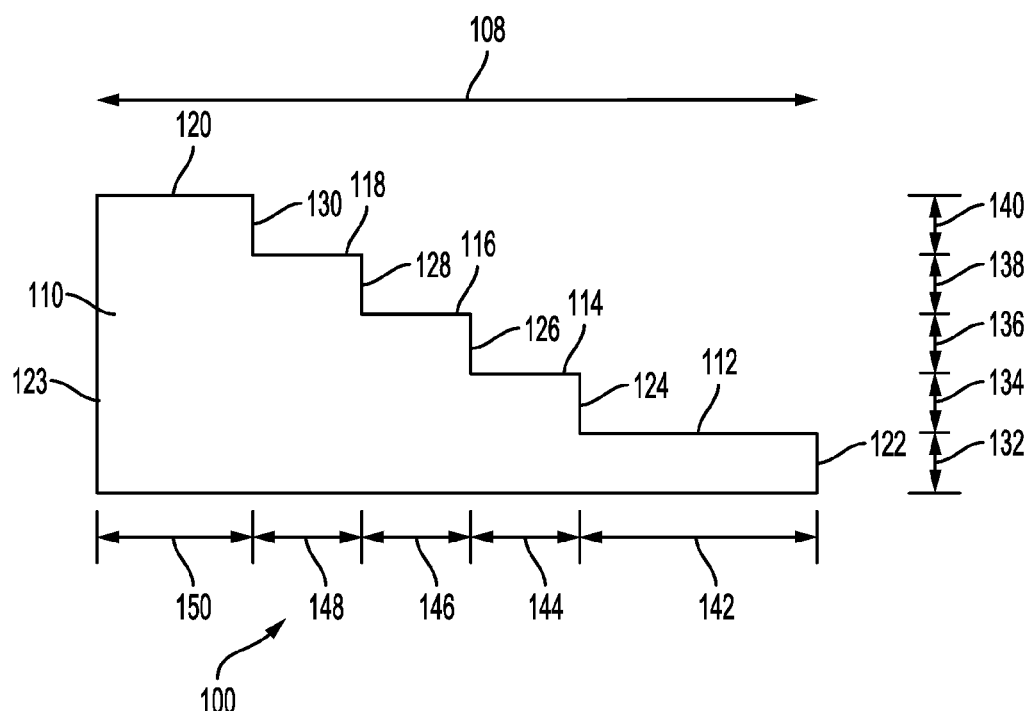
FIG. 2 is a cross-sectional side view of the package substrate of FIG. 1, in accordance with various embodiments.

FIG. 2 is a cross-sectional side view of the package substrate 100 of FIG. 1 and, in particular, illustrates the heights and depths of various portions of the package substrate 100. The base surface 112 may have a height 132, the step surface 114 may have a height 134, the step surface 116 may have a height 136, the step surface 118 may have a height 138, and the step surface 120 may have a height 140. As used herein, a "height" of a base surface of a package substrate may refer to a thickness of an insulating material (e.g., the insulating material 110) underlying the base surface 112. A "height" of a step surface may refer to a perpendicular distance between a plane containing the step surface and a plane containing the next "lowest" step surface (or base surface, if the step surface is the "first" step surface). The height of a step surface may also correspond to the height of the rise between the step surface and the next "lowest" step surface.

In some embodiments, the portion of insulating material 110 having the stairstep structure may form the entire package substrate 100 (e.g., the portion of insulating material 110 depicted in FIG. 1 may provide substantially all of the insulating material of a package substrate 100, and the areas 122 and 123 may be formed by singulation of the package substrate 100 from other package substrates). In other embodiments, the portion of insulating material 110 depicted in FIG. 1 may be a subset of the insulating material of a package substrate 100, and the package substrate 100 may include additional insulating material structure as well (e.g., at and beyond the areas 122 and/or 123, not shown in FIGS. 1 and 2).

The base surface 112 may have a depth 142, the step surface 114 may have a depth 144, the step surface 116 may have a depth 146, the step surface 118 may have a depth 148, and the step surface 120 may have a depth 150. As used herein, a "depth" of a base surface or a step surface of a package substrate may refer to a dimension of the base surface or the step surface along a second axis 108 (perpendicular to the first axis 106).

The number of step surfaces and particular heights and depths illustrated in the embodiment of the package substrate 100 of FIGS. 1 and 2 are simply illustrative, and a package substrate 100 may have one or more step surfaces of any desired dimensions. For example, the heights of all of the step surfaces of the package substrate 100 (e.g., the heights 134, 136, 138, and 140) may be the same in some embodiments, while in other embodiments, one or more of the heights may be different. In some embodiments, the depths of all of the step surfaces of the package substrate 100 (e.g., the depths 144, 146, 148, and 150), while in other embodiments, one or more of the depths may be different.

As noted above, in some embodiments, only a portion of a larger package substrate may have a stairstep profile; other portions of the larger package substrate may have other profiles. In other embodiments, a cross-section of the entirety of a package substrate may have a stairstep profile. For example, in the particular embodiment illustrated in FIGS. 1 and 2, the area 123 of the portion of insulating material 110 may provide a side face of the package substrate 100, the area 122 of the portion of insulating material 110 may provide a side face of the package substrate 100, and these side faces may be opposite to each other along the second axis 108. In other words, substantially all of the package substrate 100 may have a stairstep profile.

In some embodiments, the package substrate 100 may have reciprocal symmetry. As used herein, a structure may have "reciprocal symmetry" when two copies of the structure can be fit together to form a substantially solid rectangular block. In some embodiments, a reciprocally symmetric structure may be formed by dividing a rectangular block of material (which may include insulating material, conductive material, and/or any other suitable material) into two identical structures. An example of a reciprocally symmetric package substrate 100 is illustrated in FIG. 12. In particular, FIG. 12 illustrates two reciprocally symmetric package substrates 100 formed in accordance with the manufacturing operations discussed below with reference to FIGS. 7-12.

In one example embodiment in which the package substrate 100 of FIGS. 1 and 2 has reciprocal symmetry, the height 132 and the depth 142 may be equal to the height 140 and the depth 148, respectively, the height 134 and the depth 144 may be equal to the height 138 and the depth 146, respectively. In this example embodiment, two copies of the package substrate 100 may be fit together to form a rectangular block by abutting the rises 124 and 126 of one copy of the package substrate 100 against the rises 128 and 126 of the second copy of the package substrate 100, respectively.

In another example embodiment in which the package substrate 100 of FIGS. 1 and 2 has reciprocal symmetry, the depth 142 and the height 134 may be equal to the depth 150 and the height 140, respectively, the depth 144 and the height 136 may be equal to the depth 148 and the height 138, respectively. In this example embodiment, two copies of the package substrate 100 may be fit together to form a rectangular block by abutting the rises 124 and 126 of one copy of the package substrate 100 against the rises 130 and 128 of the second copy of the package substrate 100, respectively.

Figure 24:
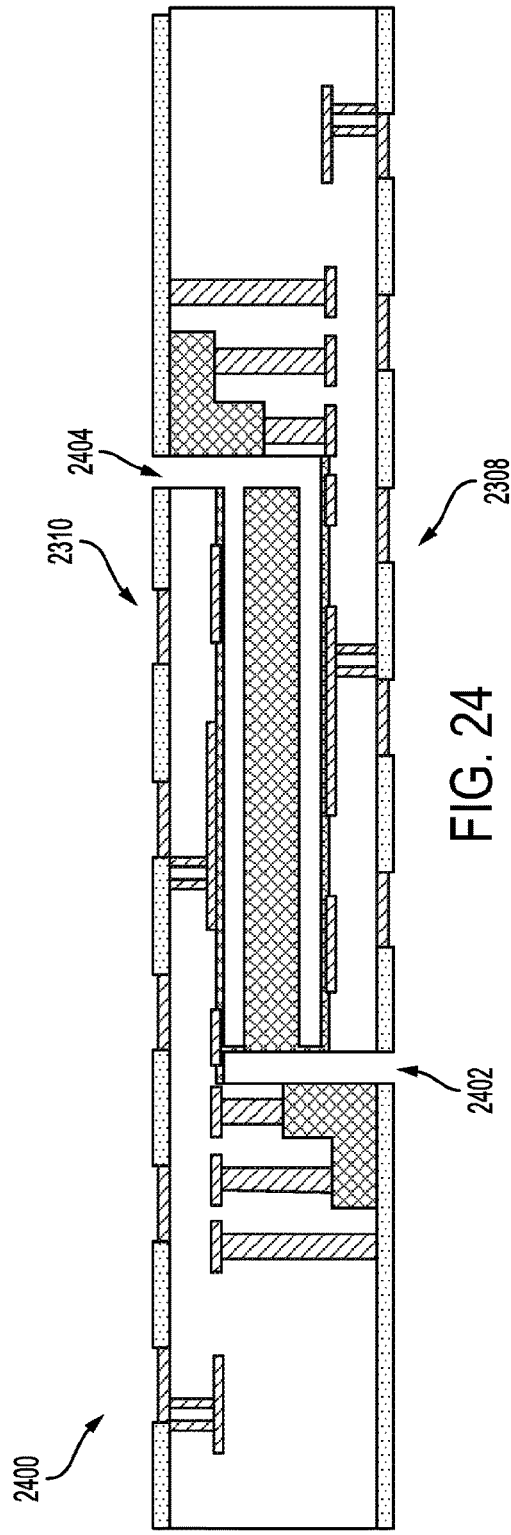
Figure 25:
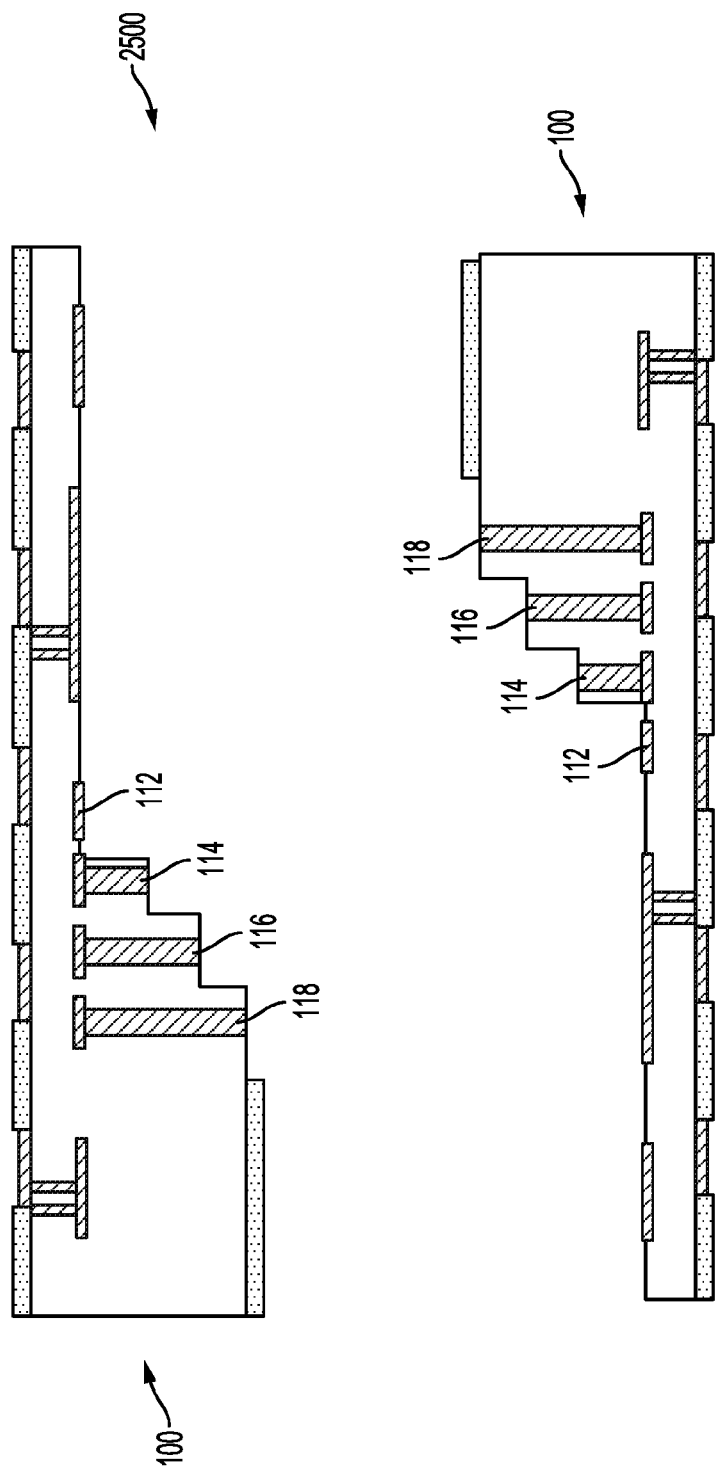

In some embodiments, the package substrate 100 may have approximate reciprocal symmetry. As used herein, a structure may have "approximate reciprocal symmetry" when two copies of the structure can be fit together such that the outer faces of the fit-together assembly substantially form a rectangular block, though voids may be present in the fit-together assembly. In some embodiments, an approximately reciprocally symmetric structure may be formed by forming a rectangular block of material (which may include insulating material, conductive material, and/or any other suitable material) into two identical structures, with some of the material from the "interior" of the rectangular block not included in either of the structures. An example of an approximately reciprocally symmetric package substrate 100 is illustrated in FIG. 25. In particular, FIG. 25 illustrates two reciprocally symmetric package substrates 100 formed in accordance with the manufacturing operations discussed below with reference to FIGS. 23-25.

Figure 3:
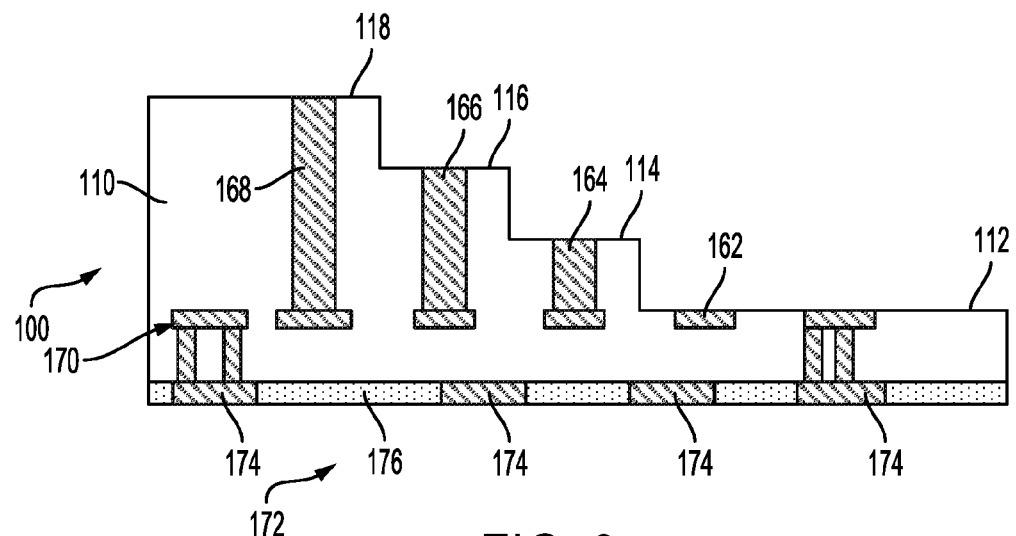
FIG. 3 is a cross-sectional side view of a package substrate having a stairstep profile and a metal layer, in accordance with various embodiments.

In some embodiments, the package substrate 100 may include one or more metal layers and/or other conductive pathways through the insulating material 110. A metal layer may be printed or otherwise patterned to form conductive traces for the flow of electricity. These metal layers and/or other conductive pathways may facilitate the transfer of electrical signals (e.g., power, ground, and data) through the package substrate 100 and to devices coupled to the package substrate 100 (e.g., dies, as discussed below with reference to FIGS. 4-6). For example, FIG. 3 is a cross-sectional side view of the package substrate 100 having a stairstep profile and a metal layer 170, in accordance with various embodiments. Conductive pathways extend between various ones of the step surfaces and the metal layer 170. For example, a conductive pathway 168 extends between the step surface 118 and the metal layer 170, a conductive pathway 166 extends between the step surface 116 and the metal layer 170, and a conductive pathway 164 extends between the step surface 114 and the metal layer 170. As used herein, a "conductive pathway" may include a pillar of conductive material (e.g., a metal, such as copper), a through-hole plated with a conductive material, a via filled with a conductive material, a vertical or planer trace, a wire, or any other conductive pathway along which electrical signals are to flow. In some embodiments, conductive pathways may include solder pads at the surfaces from which they extend. For example, the conductive pathway 168 may include a solder pad at the step surface 118, the conductive pathway 166 may include a solder pad at the step surface 116, and the conductive pathway 164 may include a solder pad at the step surface 114.

In some embodiments, metal portions within the metal layer 170 may be exposed at one or more surfaces of the package substrate 100 to provide conductive pathways (e.g., as a solder pad). For example, the base surface 112 may include the metal layer 170 such that a portion of the metal layer 170 may be exposed at the base surface 112 to provide a solder pad for conductive pathway 162. The conductive pathway 162 may include, for example, a solder pad. Although a single metal layer 170 is illustrated in FIG. 3, various embodiments of the package substrate 100 may include multiple metal layers. In embodiments having multiple metal layers, conductive pathways may extend from various surfaces of the package substrate 100 to one or more of the multiple metal layers. In some embodiments, all of the conductive pathways from various surfaces of the package substrate 100 (e.g., the step surfaces 114 and 116 of FIG. 3)

may extend to a common metal layer (e.g., the metal layer 170 of FIG. 3), while in other embodiments, different ones of the conductive pathways may extend to different ones of multiple metal layers included in the package substrate 100. In some embodiments (e.g., as illustrated in FIG. 3), no metal layer may be disposed between the top step surface 118 of the package substrate 100 and a plane that includes the base surface 112.

The package substrate 100 of FIG. 3 also includes a ball grid array (BGA) attachment surface 172. The BGA attachment surface 172 may include solder pads 174 spaced apart by areas of solder resist 176. Any suitable solder resist may be used with the embodiments disclosed herein, such as solder resists including acrylic resin and monomers, epoxy resin, fillers, pigments, etc. An example of a solder resist that may be used in various applications includes solder material from the PFR-800 AUS410 and PSR-4000 AUS320 series manufactured by Taiyo Ink Manufacturing Co. (Saitama, Japan), or similar materials. In some embodiments, the solder pads 174 may be spaced apart evenly, while in other embodiments, the solder pads 174 may not be spaced apart evenly. The solder pads 174 may be coupled to other structures in the package substrate 100 via conductive pathways to enable electrical signals to flow between the solder pads 174 and the other structures. For example, FIG. 3 illustrates the solder pad 174 coupled to the metal layer 170 via a conductive pathway. When used in a package, solder balls (not shown in FIG. 3) may be coupled to the solder pads 174 of the package substrate 100 of FIG. 3 to form conventional BGA attachment structures used to couple the package substrate 100 to another component (e.g., a motherboard or another IC package (to form a package-on-package (PoP) structure)).

As noted above with reference to FIGS. 1 and 2, the number of step surfaces and particular heights and depths illustrated in the embodiment of the package substrate 100 of FIG. 3 are simply illustrative, and a package substrate 100 may have one or more step surfaces of any desired dimensions. In some embodiments, the package substrate 100 as discussed above with reference to FIG. 3 may have reciprocal symmetry. In some embodiments, the package substrate 100 as discussed above with reference to FIG. 3 may have approximate reciprocal symmetry. In some embodiments, the package substrate 100 as discussed above with reference to FIG. 3 may not be reciprocally symmetric.

Electronic devices that utilize the package substrates disclosed herein (e.g., any of the package substrates 100) may have one or more of any of a number of advantages over conventional flat substrates with traditional die stacking. For example, some embodiments may achieve the elimination of wire bonds, improved electrical performance relative to traditional die stacking, fewer assembly steps (e.g., the elimination of assembly steps related to the formation of wire bonds), reduced overall height of the device for the same number of dies (due to, e.g., the ability to include more than one die in a single package), and/or a greater density of dies per unit of height. For example, embodiments of IC packages that include a stairstep substrate and the FC-type die stackup disclosed herein may be thinner and have better electrical performance than conventional package technologies. Multi-chip flip chip packages may thus be effectively realized.

Additionally, some embodiments of the package substrates disclosed herein may include fewer metal layers than required by conventional die-stacking approaches. For example, in the package substrate 100 of FIG. 3, only two layers of metallization (the metal layer 170 and the solder pads 174 at the BGA attachment surface 172) may be used, and conductive pathways (the conductive pathways 164-168 formed by, e.g., plated through holes or blind vias) may provide electrical connections between the step surfaces and a metallization layer (rather than including a different metal layer for each step surface). This reduction in the number of metal layers relative to traditional techniques may reduce the time and cost of manufacturing a package substrate.

The package substrates 100 disclosed herein may be coupled to one or more dies to form an IC assembly. In some embodiments, an IC assembly may be a package, a PoP assembly, or any other suitable structure. The package substrates disclosed herein may be particularly advantageous for applications in which multiple dies are to be included in a package. An example of such an application is memory packages (such as dynamic random access memory (DRAM) packages), in which the dies represent memory units and multiple such units are included in a package.

Figure 4:
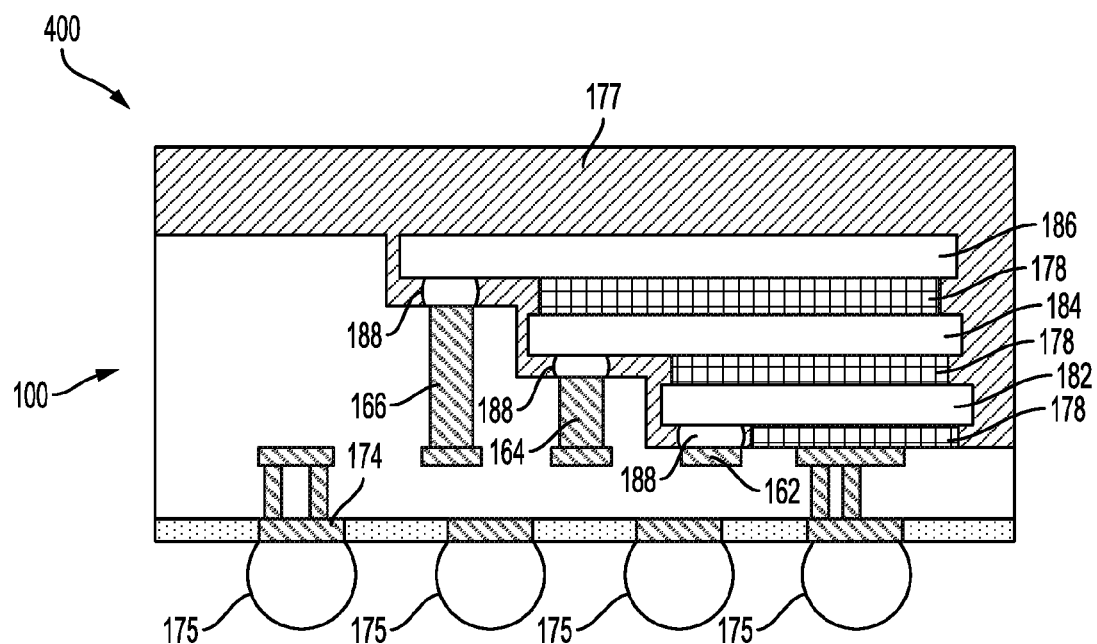
FIG. 4 is a cross-sectional side view of an IC assembly including a mold material and a package substrate with a stairstep profile, in accordance with various embodiments.
Figure 5:
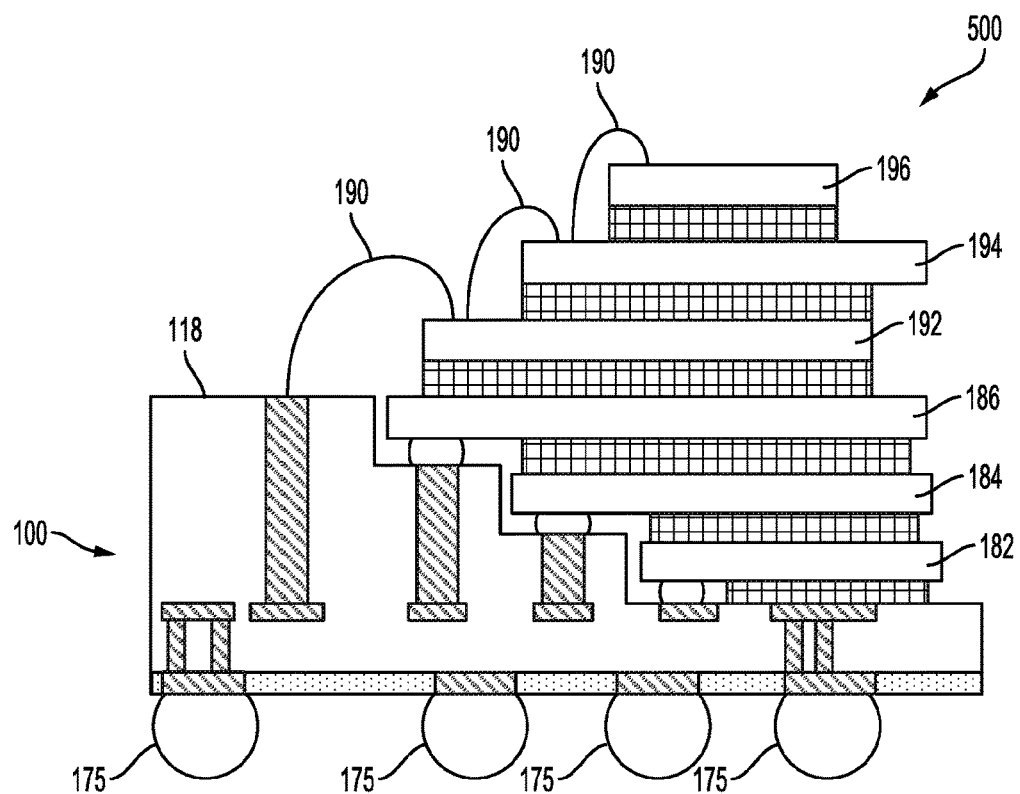
FIG. 5 is a cross-sectional side view of an IC assembly including a die wire-bonded to a package substrate having a stairstep profile, in accordance with various embodiments.
Figure 6:
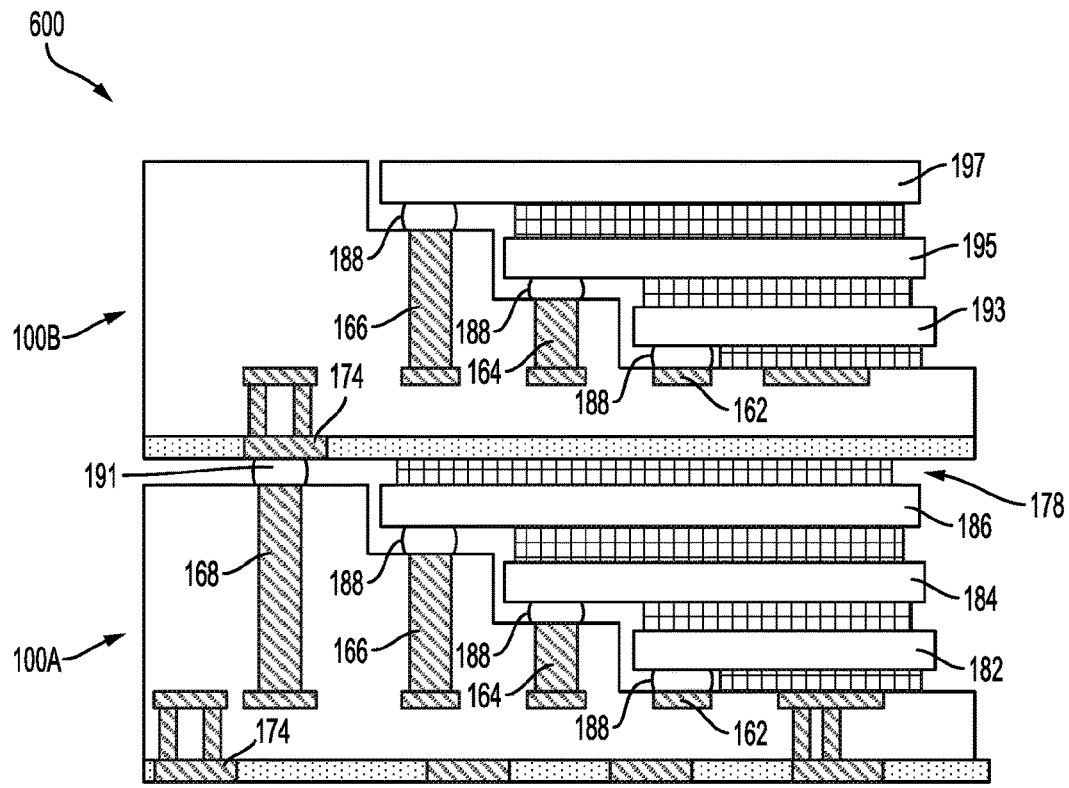
FIG. 6 is a cross-sectional side view of an IC assembly including two package substrates with stairstep profiles, in accordance with various embodiments.

FIGS. 4-6 illustrate various examples of IC assemblies including package substrates with stairstep profiles. In particular, for ease of illustration, each of the IC assemblies illustrated in FIGS. 4-6 includes at least the components of the package substrate 100 discussed above with reference to FIG. 3. The number of step surfaces, particular heights and depths, and numbers and sizes of dies illustrated in the embodiments of the IC assemblies of FIGS. 4-6 are simply illustrative, and the IC assemblies disclosed herein may include any suitable number and arrangement of these elements in accordance with the present disclosure. In some embodiments, a package substrate 100 as discussed below with reference to FIGS. 4-6 may have reciprocal symmetry. In some embodiments, a package substrate 100 as discussed below with reference to FIGS. 4-6 may have approximate reciprocal symmetry. In some embodiments, a package substrate 100 as discussed below with reference to FIGS. 4-6 may not be reciprocally symmetric. The IC assemblies of FIGS. 4-5 may provide IC packages, while the IC assembly of FIG. 6 may be a PoP structure.

FIG. 4 is a cross-sectional side view of an IC assembly 400 including a mold material 177 and the package substrate 100 with a stairstep profile, in accordance with various embodiments. The package substrate 100 of the IC assembly 400 may take the form of any of the embodiments discussed above with reference to FIGS. 1-3. In particular, the package substrate 100 depicted in FIG. 4 is substantially identical to the package substrate 100 depicted in FIG. 3 but does not include the conductive pathway 168.

In the IC assembly 400, a first die 182 may be electrically coupled to the base surface 112 by a conductive material 188 disposed between the first die 182 and the base surface 112. In particular, the conductive material 188 may include a solder material coupling a conductive contact of the first die 182 to the conductive pathway 162 associated with the base surface 112. A second die 184 may be electrically coupled to the step surface 114 by the conductive material 188 disposed between the second die 184 and the step surface 114. In particular, the conductive material 188 may include a solder material coupling a conductive contact of the second die 184 to the conductive pathway 164 disposed between the step surface 114 and the metal layer 170. A third die 186 may be electrically coupled to the step surface 116 by the conductive material 188 disposed between the third die 186 and the step surface 116. In particular, the conductive material 188 may include a solder material coupling a conductive contact of the third die 186 to the conductive pathway 166 disposed between the surface 116 and the metal layer 170.

In the IC assembly 400, the second die 184 may extend over the first die 182 such that the first die 182 is at least partially disposed between the second die 184 and the base surface 112. The third die 186 may extend over the second die 184 such that the second die 184 is at least partially disposed between the third die 186 and the step surface 114. In some embodiments, the third die 186 may extend over the second die 184 such that the second die 184 is at least partially disposed between the third die 186 and the first die 182 (as illustrated in FIG. 4).

A die attach film or paste may be disposed "under" each of the dies included in the IC assembly 400 to mechanically stabilize the dies in the IC assembly 400. In particular, a die attach film/paste 178 may be disposed between the first die 182 and the base surface 112, a die attach film/paste 178 may be disposed between the second die 184 and the first die 182, and the die attach film/paste 178 may be disposed between the third die 186 and the second die 184. Any suitable die attach film, paste, or other material may be used for mechanical stabilization in the IC assembly 400 (and other IC assemblies disclosed herein). An example die attach film that may be suitable in some applications is the EM-760L2 series of die attach film manufactured by Nitto Denko Corporation (Osaka, Japan), and similar materials.

As discussed above with reference to FIG. 3, FIG. 4 also illustrates solder balls 175 coupled to the solder pads 174 of the BGA attachment surface 172. The solder balls 175 may be used to couple the IC assembly 400 to another component (e.g., a circuit board), as conventionally known.

The first die 182, the second die 184, and the third die 186 may have any suitable structure. For example, in some embodiments, one or more of these dies may be flip chip dies and may be constructed in accordance with known flip chip structures.

The mold material 177 may be provided to the IC assembly 400 subsequent to coupling the dies 182-186 to the package substrate 100. The mold material 177 may provide mechanical stabilization and protection to the electrical components of the IC assembly 400. Any suitable mold material may be used in the IC assembly 400 (and other IC assemblies disclosed herein). An example mold material that may be suitable in some applications is the EME-G771 series of epoxy molding compound manufactured by Sumitomo Bakelite Co. (Tokyo, Japan).

In some embodiments, additional dies may be "stacked" on top of dies coupled to the package substrate 100 via solder, and these "stacked" dies may be coupled to the package substrate 100 via wire bonding. For example, FIG. 5 is a cross-sectional side view of an IC assembly 500 including a die 192 wire-bonded to the package substrate 100 having a stairstep profile, in accordance with various embodiments. The package substrate 100 of the IC assembly 500 may take the form of any of the embodiments discussed above with reference to FIGS. 1-3. In particular, the IC assembly 500 illustrates a package substrate 100 to which the three dies 182-186 are coupled as described above with reference to the IC assembly 400 of FIG. 4. Various reference numerals have been omitted from FIG. 5 for ease of illustration.

The die 192 of the IC assembly 500 may be wire-bonded to the package substrate 100, via a wire 190 from a conductive contact on the die 192 to the step surface 118 (here, the top step surface), to electrically couple the die 192 to a conductive pathway 168 extending from the step surface 118 to a metal layer. The die 192 may be positioned in the IC assembly 500 such that the third die 186 is at least partially disposed between the die 192 and the second die 184. A die 194 may be wire-bonded to the package substrate 100, via the wire 190 from a conductive contact on the die 194 to a conductive contact on the die 192, and the die 194 may be positioned in the IC assembly 500 such that the die 192 is at least partially disposed between the die 194 and the third die 186. A die 196 may be wire-bonded to the package substrate 100, via the wire 190 from a conductive contact on the die 196 to a conductive contact on the die 194, and the die 196 may be positioned in the IC assembly 500 such that the die 194 is at least partially disposed between the die 196 and the die 192. Die attach film or paste may be disposed between adjacent dies. Thus, as illustrated in FIG. 5, multiple FC dies may be embedded in a mold material "underneath" one or more wire-bonded dies to increase the density of dies over the footprint of the IC assembly 500.

In some embodiments, multiple package substrates 100 (and dies coupled to them) may be stacked. For example, FIG. 6 is a cross-sectional side view of an IC assembly 600 including two package substrates 100A and 100B with stairstep profiles, in accordance with various embodiments. In FIG. 6, the package substrate 100A may take the form of the package substrate 100 of FIG. 5, and the package substrate 100B may take the form of the package substrate 100 of FIG. 4, but these are simply illustrative, and the package substrates 100A and 100B may take the form of any suitable ones of the package substrates 100 disclosed herein.

In the IC assembly 600, dies 182, 184, and 186 may be coupled to base and/or step surfaces of the package substrate 100A (e.g., as discussed above with reference to FIG. 5), and dies 193, 195, and 197 may be coupled to base and/or step surfaces of the package substrate 100B (e.g., as discussed above with reference to FIG. 4). The package substrate 100B may be electrically coupled to the package substrate 100A by a conductive pathway 191 disposed between the package substrate 100A and the package substrate 100B. In particular, FIG. 6 illustrates an embodiment in which the conductive pathway 191 may include solder coupled to a solder pad on the top step surface of the package substrate 100A, but the package substrate 100A may be electively coupled to the package substrate 100B using any suitable technique (e.g., wire bonding). The die attach film/paste 178 may be disposed between the IC package substrate 100B and the die 186 to mechanically secure the IC package substrate 100B to the IC package substrate 100A. The IC assembly 600 may be an example of a PoP structure, wherein one IC package is provided by the package substrate 100A and the dies 182-186 coupled to it, and another IC package is provided by the package substrate 100B and the dies 193-197 coupled to it.

Any suitable technique may be used to form the various package substrates and assemblies disclosed herein. For example, FIGS. 7-12 illustrate various stages in the manufacture of the package substrate 100 having a stairstep profile and reciprocal symmetry, in accordance with certain embodiments. The manufacturing stages and operations discussed below with reference to FIGS. 7-12 are illustrative, and any other suitable operations (and corresponding stages) may be used to form any suitable embodiments of the package substrate 100 in accordance with the teachings herein.

Figure 7:
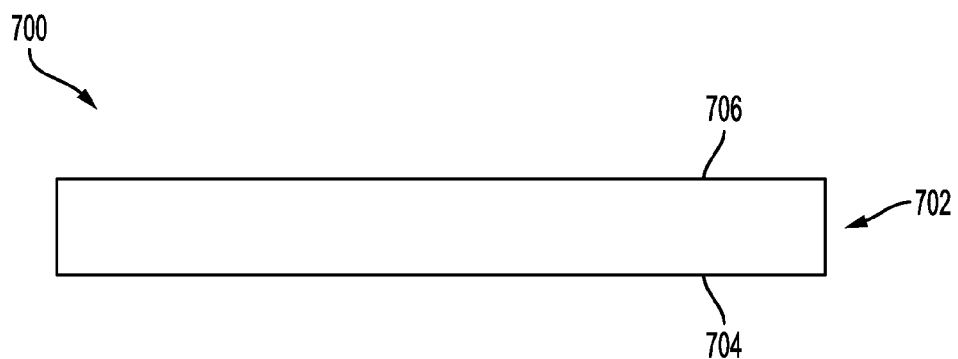
FIGS. 7-12 illustrate various stages in the manufacture of a package substrate having a stairstep profile and reciprocal symmetry, in accordance with various embodiments.

FIG. 7 depicts an assembly 700 including a first layer 702. The first layer 702 may include an insulating material (e.g., any of the insulating materials discussed above with reference to the insulating material 110), and may have a first surface 704 opposite to a second surface 706.

Figure 8:
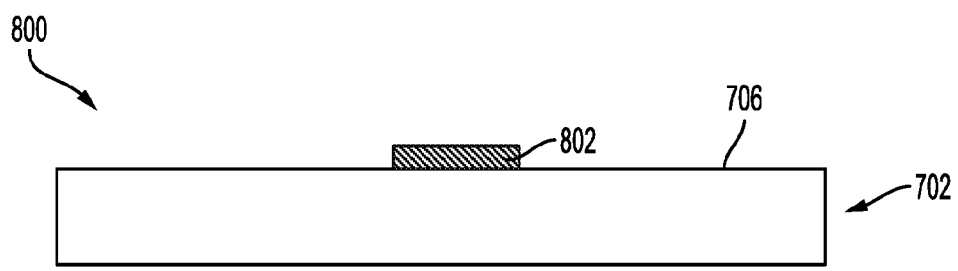

FIG. 8 depicts an assembly 800 subsequent to providing an area of release material 802 on the second surface 706 of the first layer 702 of the assembly 700. In particular, the area of release material 802 may be "centered" on the first layer 702, as shown. The release material 802 (and any of the release materials disclosed herein) may be any suitable material that allows package substrate structures disposed on either side of an area of the release material 802 to be separated at the release material 802 when sufficient force is applied, without deforming the package substrates (e.g., as discussed below with reference to FIG. 12). In some embodiments, the release material 802 may have a low reactivity (e.g., with strong internal bonds). In some embodiments, the release material 802 may have a low van der Waals force susceptibility. In some embodiments, the release material 802 may have little to no open-cell porosity. The particular values of various material properties of the release material 802 may be determined based on the material properties and structure of the package substrate 100, and the available separation methods, so as to achieve separation without significant deformation or compromise of the package substrate 100. Examples of classes of materials that may be used for the release material 802 are suitable fluoropolymers and suitable fluorocarbon polymers. Other examples of release materials that may be useful in certain embodiments are siloxanes (silicone-based polymers), or flaky materials (e.g., talc) that may be infiltrated by adhesives in a prepreg insulating material but may have a weak enough interface to allow breakage and separation. The area of release material 802 may be provided to the first layer 702 using any suitable technique (e.g., any suitable printing technique), such as screen printing.

Figure 9:
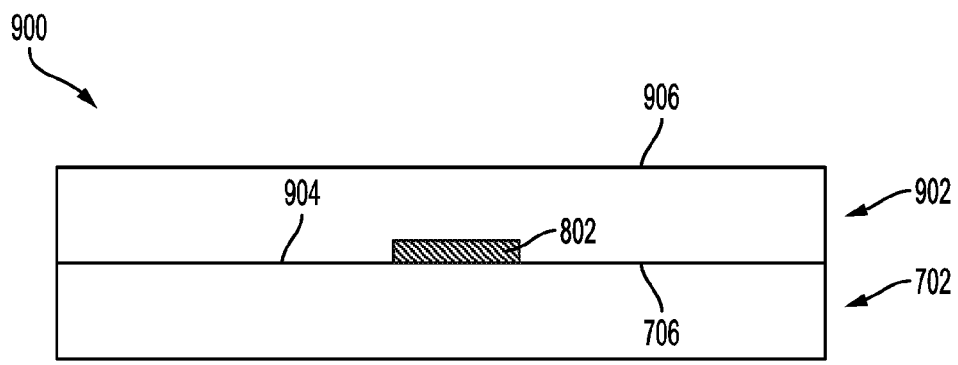

FIG. 9 depicts an assembly 900 subsequent to providing a second layer 902 on the assembly 800. The second layer 902 may include an insulating material (e.g., any of the insulating materials discussed above with reference to the insulating material 110). In some embodiments, the insulating material of the second layer 902 may be the same insulating material as used in the first layer 702. The second layer 902 may have a first surface 904 and a second surface 906 opposite to the first surface 904. The second layer 902 may be disposed on the second surface 706 of the first layer 702 such that the area of release material 802 may be disposed between the second layer 902 and the first layer 702. Although the area of release material 802 is depicted in FIGS. 8-11 as having a significant "thickness" with reference to the "thicknesses" of the first layer 702 and the second layer 902, this is simply for illustrative purposes. In practice, the thickness of the area of release material 802 may be substantially smaller than the thicknesses of the first layer 702 and the second layer 902, such as the first layer 702 and the second layer 902 may simply "sandwich" the area of release material 802 without substantial deformation.

Figure 10:
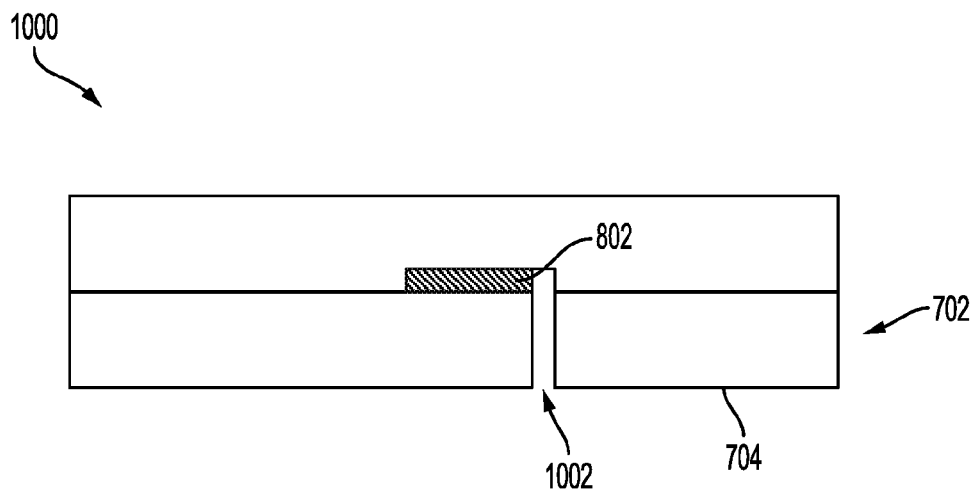

FIG. 10 depicts an assembly 1000 subsequent to cutting the first layer 702 through the first surface 704 of the first layer 702 to reach at least the area of release material 802 and to form a gap 1002. As shown in FIG. 10, the gap 1002 may be located at one end of the area of release material 802. In some embodiments, the gap 1002 may be formed by laser cutting. A laser may be particularly appropriate for forming the gap 1002 when the thickness of the first layer 702 is less than or equal to approximately 100 μm. In some embodiments, the gap 1002 may be formed by use of a mechanical saw or router.

Figure 11:
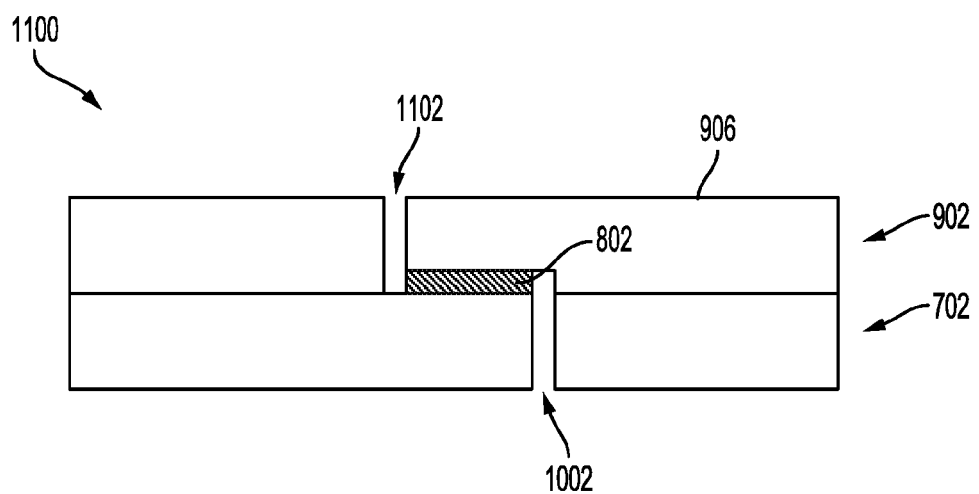
Figure 12:
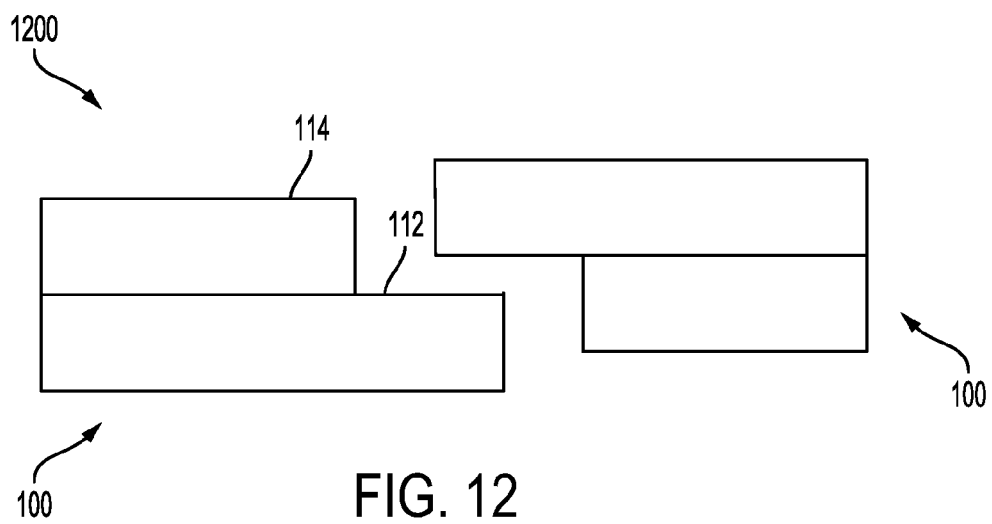

FIG. 11 depicts an assembly 1100 subsequent to cutting the second layer 902 through the second surface 906 of the second layer 902 to reach at least the area of release material 802 and to form a gap 1102. As shown in FIG. 11, the gap 1102 may be located at the opposite end of the area of release material 802 from the gap 1002. In some embodiments, the gap 1102 may be formed by laser cutting and/or by the use of a mechanical saw or router, as discussed above.

FIG. 12 depicts an assembly 1200 subsequent to separating the assembly 1100 along the release material 802 and the gaps 1002 and 1102 to form two package substrates 100. As discussed above with reference to FIG. 8, the release material 802 may have chemical and physical properties that allow the two package substrates 100 to be separated at the release material 802 by the application of mechanical force without causing deformation of the two package substrates 100. Separation of multiple package substrates 100 from an assembly may be performed using any suitable technique. For example, each of the package substrates 100 and an assembly may be secured by a different vacuum apparatus, and may be separated from each other by the application of sufficient vacuum or other mechanical tension. The symmetry of the positioning of the area of the release material 802, and the formation of the gaps 1002 and 1102, results in two identical package substrates 100 having reciprocal symmetry. In particular, the assembly 1100 of FIG. 11 depicts the two package substrates 100 fit together to form a substantially solid rectangular block. In other embodiments including asymmetric positioning of the area of the release material 802 and/or the formation of the gaps 1002 and 1102, the two package substrates 100 of the assembly 1200 may not be reciprocally symmetric.

Relative to conventional three-dimensional substrate manufacturing methods (which typically use a mechanical router to remove unwanted material from a rectangular solid to form a package substrate), manufacturing methods using the techniques illustrated in FIGS. 7-12 may achieve a significant improvement in material utilization by yielding two or more package substrates per stack-up area. Additionally, with the exception of the materials and processing used to separate the package substrates (e.g., as depicted in FIG. 12), the other manufacturing operations discussed above with reference to FIGS. 7-12 may be conventional substrate manufacturing operations, and thus the manufacturing methods illustrated in FIGS. 7-12 may be more readily implemented than methods that cannot take advantage of conventional technologies.

In some embodiments, a package substrate 100 having multiple step surfaces may be formed from an initial core of insulating material. For example, FIGS. 13-22 illustrate various stages in the manufacture of a package substrate having a stairstep profile, in accordance with various embodiments. The manufacturing stages and operations discussed below with reference to FIGS. 13-22 are illustrative, and any other suitable operations (and corresponding stages) may be used to form any suitable embodiments of the package substrate 100 in accordance with the teachings herein. For example, the operations discussed below with reference to FIGS. 13-22 may be repeated as suitable to form a package substrate having more than two step surfaces.

Figure 13:
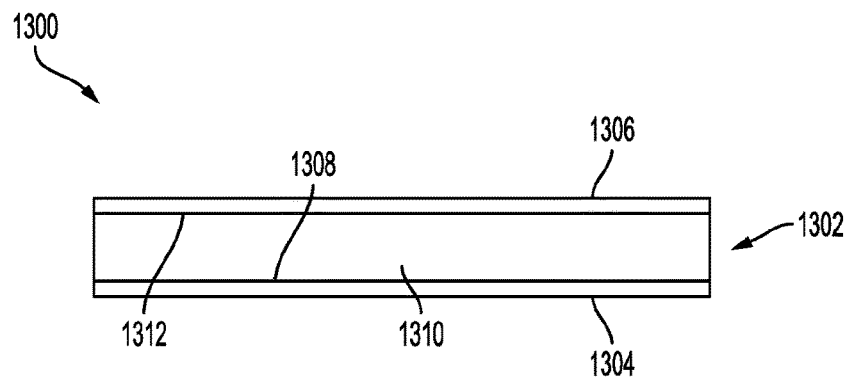
FIGS. 13-22 illustrate various stages in the manufacture of a package substrate having a stairstep profile, in accordance with various embodiments.

FIG. 13 depicts an assembly 1300 that is a core of package substrate material. In particular, the assembly 1300 is a first layer 1302 of package substrate material including an insulating material 1310, a conductive material 1308 disposed at a first surface 1304 of the first layer 1302, and a conductive material 1312 disposed at a second surface 1306 of the first layer 1302. The first layer 1302 may be, for example, a prepreg layer. In some embodiments, the conductive material 1308 and/or the conductive material 1312 may be printed or otherwise patterned to form conductive traces (not shown). The insulating material 1310 may include any of the insulating materials discussed above (e.g., any of the materials discussed with reference to the insulating material 110), and the conductive materials 1308 and 1312 may be any suitable conductive materials (e.g., metals). In alternative embodiments, the first layer 1302 may not include the conductive material 1308 or the conductive material 1312.

Figure 14:
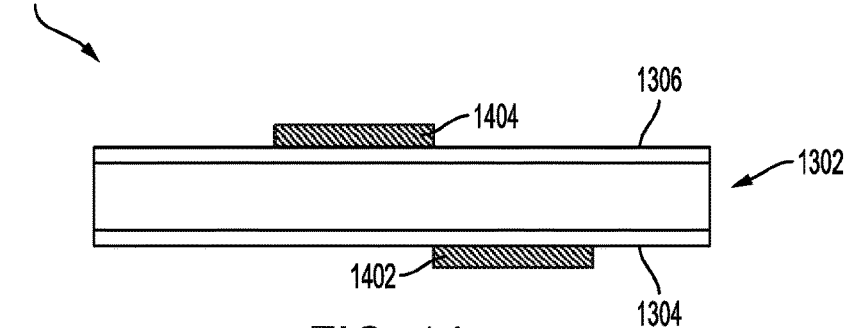

FIG. 14 depicts an assembly 1400 subsequent to providing an area of release material 1402 to the first surface 1304 of the first layer 1302 of the assembly 1300, and providing an area of release material 1404 to the second surface 1306 of the first layer 1302. The release material 1402 may take the form of any of the embodiments of the release material 802 discussed above with reference to FIG. 8. Although the areas of release material depicted in FIGS. 14-19 as having a significant "thickness" with reference to the "thicknesses" of the first layer 1302, a second layer 1502, and a third layer 1802, this is simply for illustrative purposes. In practice, the thickness of the areas of release material discussed with reference to FIGS. 14-19 may be substantially smaller than the thicknesses of the layers discussed with reference to FIGS. 14-19, and the layers may simply "sandwich" the areas of release material without substantial deformation. As illustrated in FIG. 14, one end of the release material 1404 may be positioned at the horizontal center of the first layer 1302, and the other end of the release material 1402 may be positioned at the horizontal center of the first layer 1302.

Figure 15:
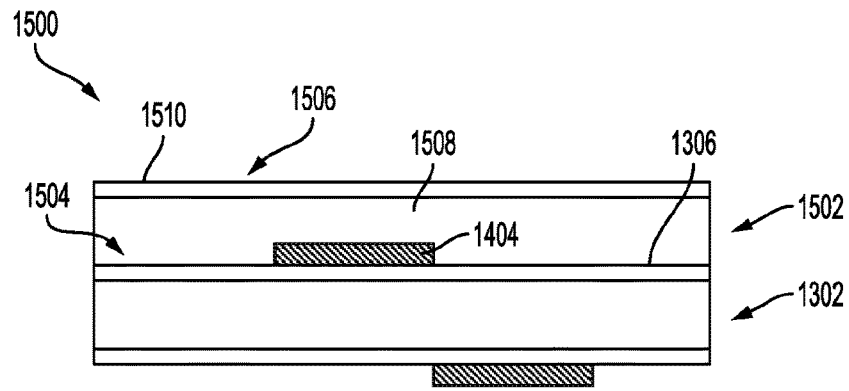

FIG. 15 depicts an assembly 1500 subsequent to providing the second layer 1502 on the assembly 1400. The second layer 1502 may include an insulating material 1508 (e.g., any of the insulating materials discussed above with reference to the insulating material 110) and a conductive material 1510 disposed at a second surface 1506. The second layer 1502 may be, for example, a prepreg layer. In some embodiments, the conductive material 1510 may be printed or otherwise patterned to form conductive traces (not shown). In some embodiments, the insulating material 1508 of the second layer 1502 may be the same insulating material as the insulating material 1310 used in the first layer 1302. The second layer 1502 may have a first surface 1504 and the second surface 1506 opposite to the first surface 1504. The second layer 1502 may be disposed on the second surface 1306 of the first layer 1302 such that the area of release material 1404 may be disposed between the second layer 1502 and the first layer 1302. In some embodiments, providing the second layer 1502 may include laminating the second layer 1502 to the assembly 1400 at a high temperature (as known in the art), or using any other suitable provisioning technique.

Figure 16:
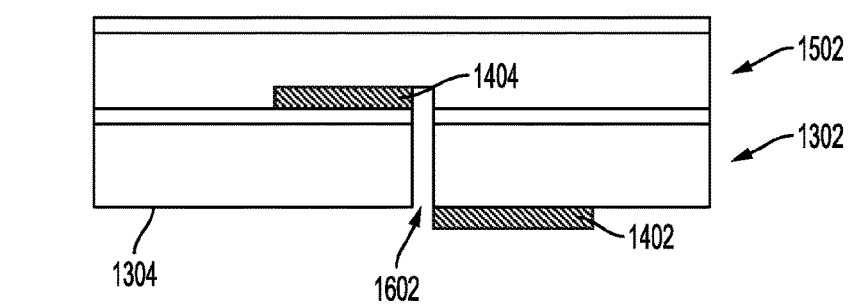

FIG. 16 depicts an assembly 1600 subsequent to cutting the first layer 1302 through the first surface 1304 of the first layer 1302 to reach at least the area of release material 1404 and to form the gap 1602. As shown in FIG. 16, the gap 1602 may be located at the approximate horizontal center of the assembly 1600, and at one end of the area of release material 1404 and one end of the area of release material 1402. In some embodiments, the gap 1602 may be formed by laser cutting and/or by the use of a mechanical saw or router, as discussed above. The assembly 1600 of FIG. 16 may be "held together" by the second layer 1502 while the gap 1602 is formed. For example, when the first layer 1302 and the second layer 1502 are formed from a prepreg material, the second layer 1502 may tightly bond to the first layer 1302 after lamination at a high temperature (e.g., as discussed above with reference to FIG. 15), and thus will help keep the assembly 1500 together upon further processing.

Figure 17:
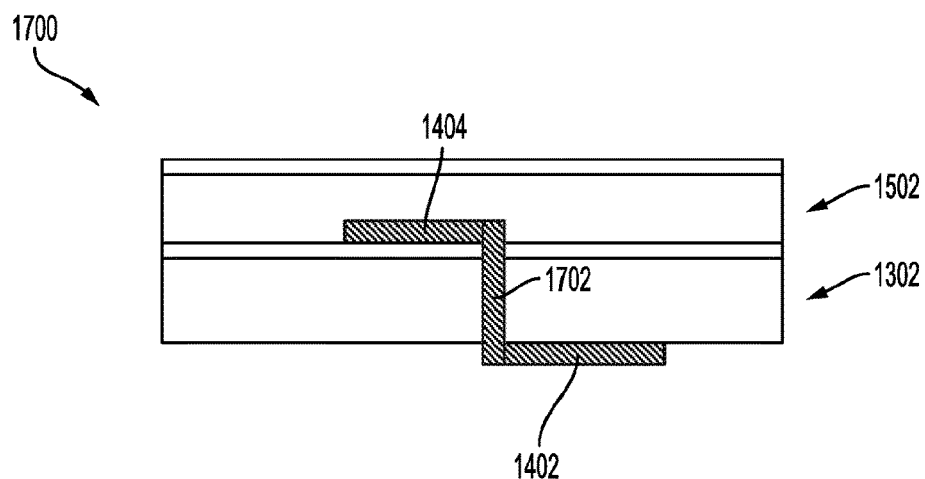

FIG. 17 depicts an assembly 1700 subsequent to filling the gap 1602 of the assembly 1600 with a release material 1702. The release material 1702 may be a same release material as used to form the areas of release material 1402 and 1404. Any suitable technique may be used to fill the gap 1602 with the release material 1702 (and to fill any other gaps with release materials, as disclosed herein). For example, in some embodiments, the release material 1702 may be screen printed into the gap 1602, provided to the gap 1602 using a silkscreen technique with a powder or liquid release material 1702, or injected into the gap 1602 using a syringe (which may, e.g., have a constant or variable feed rate of release material as a robotic platform translates the assembly 1700 horizontally and/or vertically).

Figure 18:
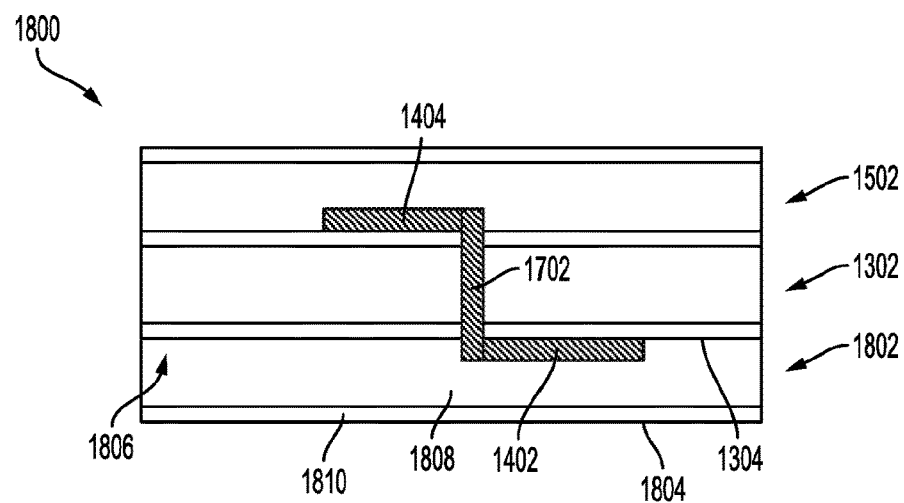

FIG. 18 depicts an assembly 1800 subsequent to providing a third layer 1802 on the assembly 1700. The third layer 1802 may include an insulating material 1808 (e.g., any of the insulating materials discussed above with reference to the insulating material 110) and a conductive material 1810 disposed at a first surface 1804. The third layer 1802 may be, for example, a prepreg layer. In some embodiments, the conductive material 1810 may be printed or otherwise patterned to form conductive traces (not shown). In some embodiments, the insulating material 1808 of the third layer 1802 may be the same insulating material as the insulating material 1310 used in the first layer 1302 and the insulating material 1508 used in the second layer 1502. The third layer 1802 may have the first surface 1804 and a second surface 1806 opposite to the first surface 1804. The third layer 1802 may be disposed on the first surface 1304 of the first layer 1302 such that the area of release material 1402 may be disposed between the third layer 1802 and the first layer 1302.

Figure 19:
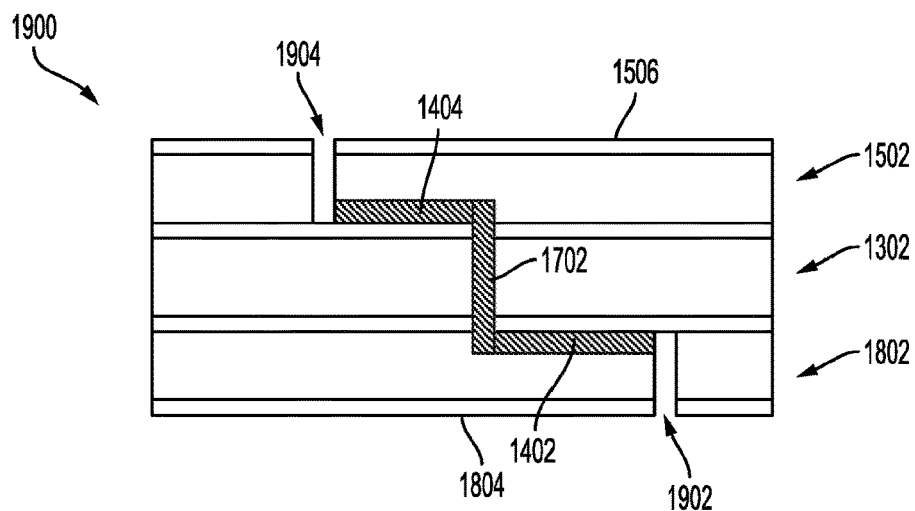

FIG. 19 depicts an assembly 1900 subsequent to cutting the second layer 1502 through the second surface 1506 of the second layer 1502 to reach at least the area of release material 1404 and to form a gap 1904, and subsequent to cutting the third layer 1802 through the first surface 1804 of the third layer 1802 to reach at least the area of release material 1402 and to form a gap 1902. As shown in FIG. 19, the gap 1902 may be located at the opposite end of the area of release material 1402 from the release material 1702, and the gap 1904 may be located at the opposite end of the area of release material 1404 from the release material 1702. In some embodiments, the gaps 1902 and 1904 may be formed by laser cutting and/or by the use of a mechanical saw or router, as discussed above. In some embodiments, after the formation of the gap 1902 but before the formation of the gap 1904, a stabilizing layer (e.g., a tape or other material) (not shown) may be provided to the first surface 1804 to mechanically stabilize the assembly 1900 and keep the components of the assembly 1900 together during further processing (e.g., during formation of the gap 1904). The stabilizing layer may be removed when suitable (e.g., when the gap 1902 is filled with a release material, as may be done if more step surfaces are desired than illustrated with reference to FIGS. 13-22). Alternately, after the formation of the gap 1904 but before the formation of the gap 1902, a stabilizing layer (not shown) may be provided to the second surface 1506 to keep the components of the assembly 1900 together during further process (e.g., during formation of the gap 1902).

Figure 20:
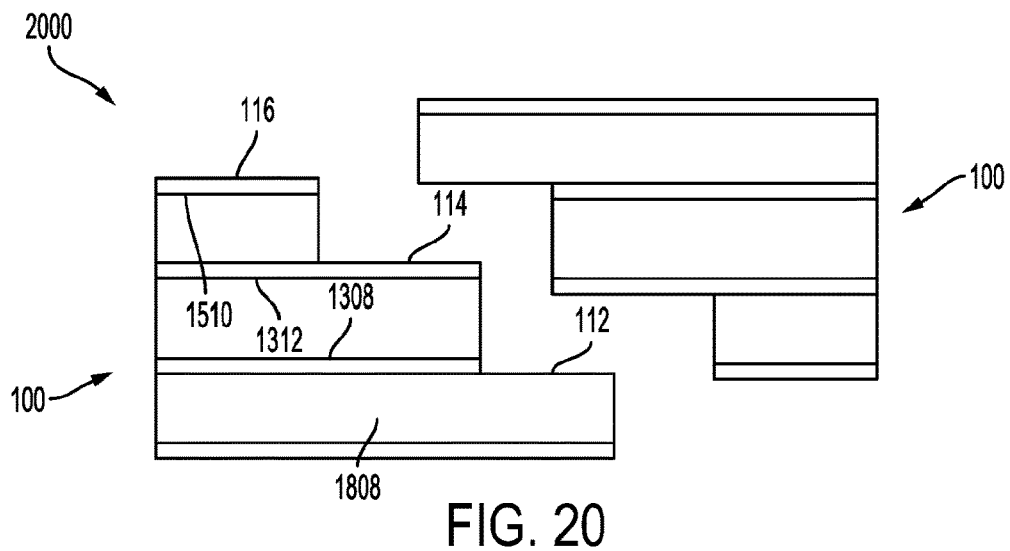

FIG. 20 depicts an assembly 2000 subsequent to separating the assembly 1900 along the release material 1402, 1404, and 1702 and the gaps 1902 and 1904 to form two package substrates 100. The symmetry of the positioning of the areas of the release material 1402 and 1404, and the formation of the gaps 1602, 1902, and 1904, results in two identical package substrates 100 having reciprocal symmetry. In particular, the assembly 1900 of FIG. 19 depicts the two package substrates 100 fit together to form a substantially solid rectangular block. In other embodiments including asymmetric positioning of the areas of the release material 1402 and 1404 and/or the formation of the gaps 1602, 1902, and 1904, the two package substrates 100 of the assembly 2000 may not be reciprocally symmetric.

Figure 21:
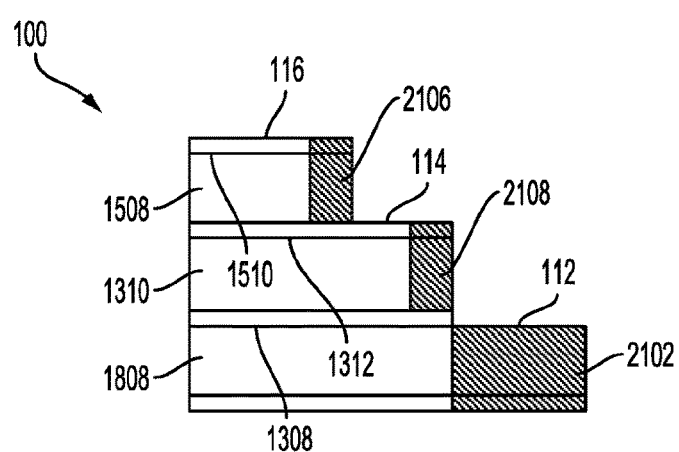
Figure 22:
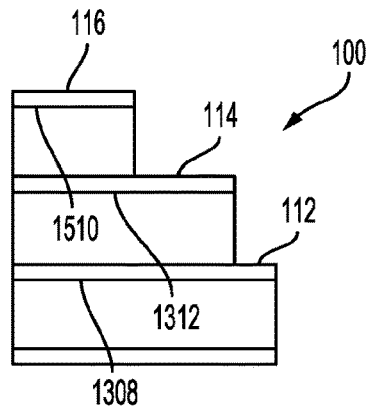

In the package substrates 100 of the assembly 2000, a portion of the insulating material 1808 is disposed at the base surface 112, a portion of the conductive material 1312 is disposed at the step surface 114, and a portion of the conductive material 1510 is disposed at the top step surface 116. In some embodiments, the package substrates 100 of the assembly 2000 may be further processed so that a conductive material is disposed at each of the base surface and the step surfaces. For example, FIG. 21 illustrates one of the package substrates 100 of the assembly 2000 and includes 3 shaded portions 2102, 2108, and 2106 to indicate portions of the package substrate 100 that may be removed (e.g., by mechanical sawing or routing) in order to form the package substrate 100 of FIG. 22. The package substrate 100 of FIG. 22 has the conductive material 1308 disposed at the base surface 112, the conductive material 1312 disposed at the step surface 114, and the conductive material 1510 disposed at the top step surface 116. The package substrate 100 of FIG. 22 may or may not be reciprocally symmetric.

Figure 23:
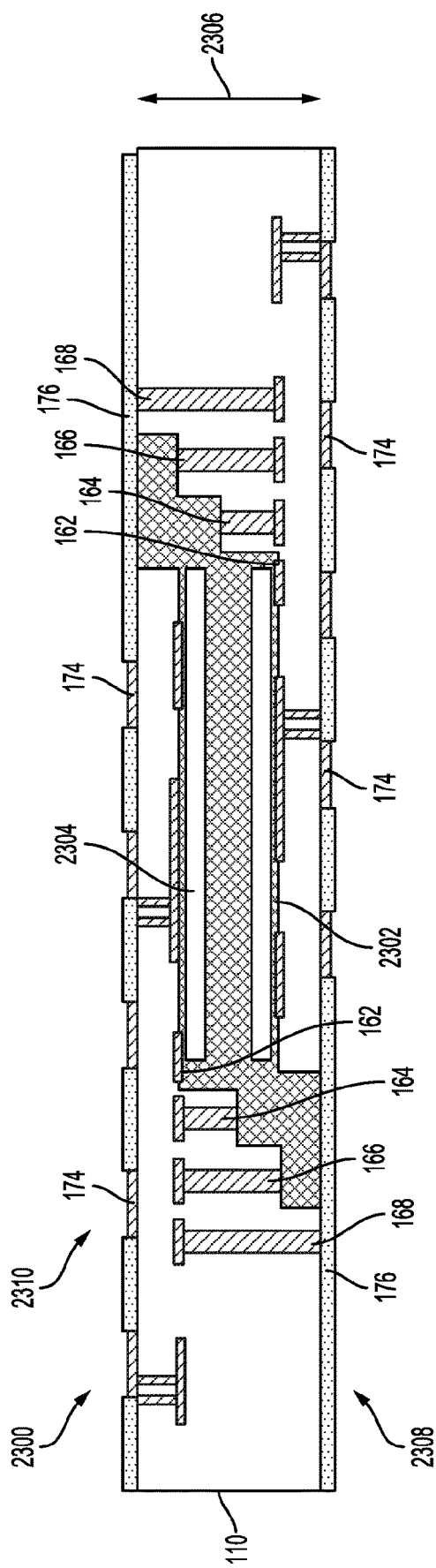
FIGS. 23-25 illustrate various stages in the manufacture of a package substrate having a stairstep profile and approximate reciprocal symmetry, in accordance with various embodiments.

As discussed above, various embodiments of the package substrates 100 disclosed herein may have approximate reciprocal symmetry. FIGS. 23-25 illustrate various stages in the manufacture of the package substrate 100 having a stairstep profile and approximate reciprocal symmetry, in accordance with various embodiments. The manufacturing stages and operations discussed below with reference to FIGS. 23-25 are illustrative, and any other suitable operations (and corresponding stages) may be used to form any suitable embodiments of the package substrate 100 in accordance with the teachings herein.

FIG. 23 illustrates an assembly 2300 that is shaped as a substantially solid rectangular block having a first surface 2308 disposed opposite to a second surface 2310 along an axis 2306. The assembly 2300 may include the insulating material 110 and two sets of the conductive pathways 162, 164, 166, and 168; solder pads 174; and solder resist 176 disposed at the first surface 2308 and the second surface 2310. The assembly 2300 also includes a first area of release material 2302 and a second area of release material 2304. The assembly 2300 may have rotational symmetry in that, if the assembly 2300 is rotated 180° within the plane of the drawing page, its structure is identical. The assembly 2300 may be formed using conventional packaging techniques. For example, the first area of release material 2302 and the second area of release material 2304 may be provided to opposite faces of a core of the insulating material 110, and holes may be drilled and conductive material (e.g., metal) deposited to form the conductive pathways 162-168. Additional conductive material may be deposited, and additional insulating material 110 may be provided, and these operations repeated to form the assembly 2300, as understood by one of ordinary skill in the art. Coreless manufacturing techniques may also be used.

FIG. 24 illustrates an assembly 2400 subsequent to cutting into the first surface 2308 of the assembly 2300 to form a gap 2402 and cutting into the second surface 2310 of the assembly 2300 to form a gap 2404. As shown in FIG. 24, the gap 2402 may extend from the first surface 2308 to one end of the area of release material 2304 (and may be adjacent to one end of the area of release material 2302), and the gap 2404 may extend from the second surface 2310 to the other end of the area of release material 2302 (and maybe adjacent to the other end of the area of release material 2304).

FIG. 25 depicts an assembly 2500 subsequent to separating the assembly 2400 along the areas of release material 2302 and 2304 and the gaps 2402 and 2404 to form two package substrates 100. The symmetry of the positioning of the areas of the release material 1402 and 1404, and the formation of the gaps 1602, 1902, and 1904, results in two identical package substrates 100 having approximate reciprocal symmetry. In the embodiment illustrated in FIG. 25 the "approximate" nature of the reciprocal symmetry arises because the final package substrates 100 do not include the insulating material 110 that is disposed between the areas of release material 2302 and 2304 and the assembly 2300. If the package substrates 100 of FIG. 25 were fit together, the outer faces of the fit-together assembly would substantially form a rectangular block, though voids would be present in the fit-together assembly. The package substrates 100 illustrated in FIG. 25 may each have a structure that is substantially similar to that discussed above with reference to the package substrate 100 of FIG. 3.

Additional processing may follow any of the manufacturing methods discussed above with reference to FIGS. 7-25. This additional processing may include any suitable procedures for achieving a bond-ready surface finish on the relevant portions of the package substrate 100. In some embodiments, this additional processing may include plasma cleaning, plating of metal (e.g., using electroless or electroplating techniques), and/or any other suitable technique performed in any suitable order.

A number of examples of IC assemblies (e.g., packages) including one or more package substrates 100 were discussed above. Any suitable technique may be used to assemble the components of such assemblies. For example, FIGS. 26-29 illustrate various stages in the manufacture of an IC assembly including the package substrate 100 of FIGS. 23-25, in accordance with various embodiments.

Figure 26:
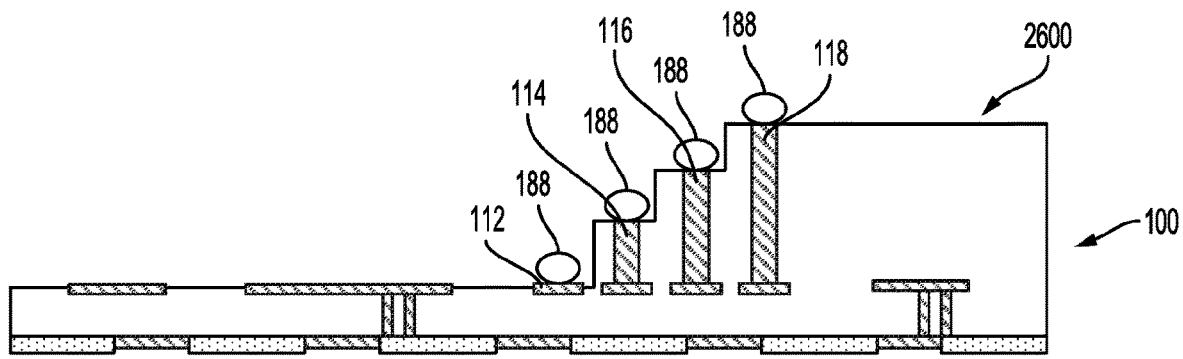
FIGS. 26-29 illustrate various stages in the manufacture of an IC assembly including the package substrate of FIGS. 23-25, in accordance with various embodiments.

FIG. 26 illustrates an assembly 2600 including the package substrate 100 subsequent to providing conductive material 188 to the conductive pathways in contact with the base surface 112 and the step surfaces 114-118. The conductive material 188 may include a solder paste that is a mixture of solder and flux and may be disposed on contact pads at the surfaces 112-118.

Figure 27:
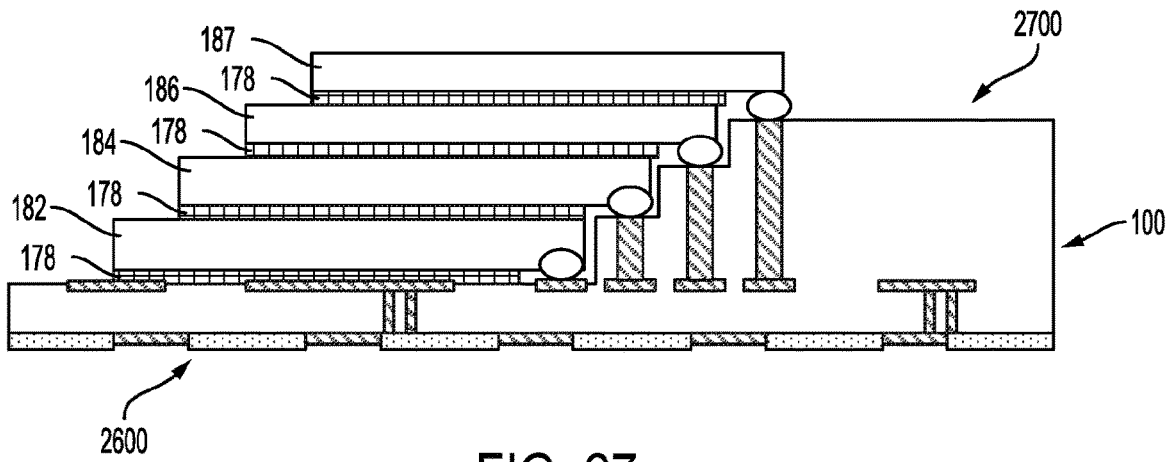

FIG. 27 illustrates an assembly 2700 subsequent to coupling the dies 182, 184, 186, and 187 to the base surface 112, and step surfaces 114, 116, and 118, respectively, via the conductive material 188 of the assembly 2600. The coupling of the dies 182-187 to the package substrate 100 may include a two-step procedure: an initial coupling via the conductive material 188 followed by a mass reflow, as known in the art. A die attach film/paste 178 may also be provided to the assembly 2600 between the base surface 112 and the die 182, between the die 182 and the die 184, between the die 184 and the die 186, and between the die 186 and the die 187.

Figure 28:
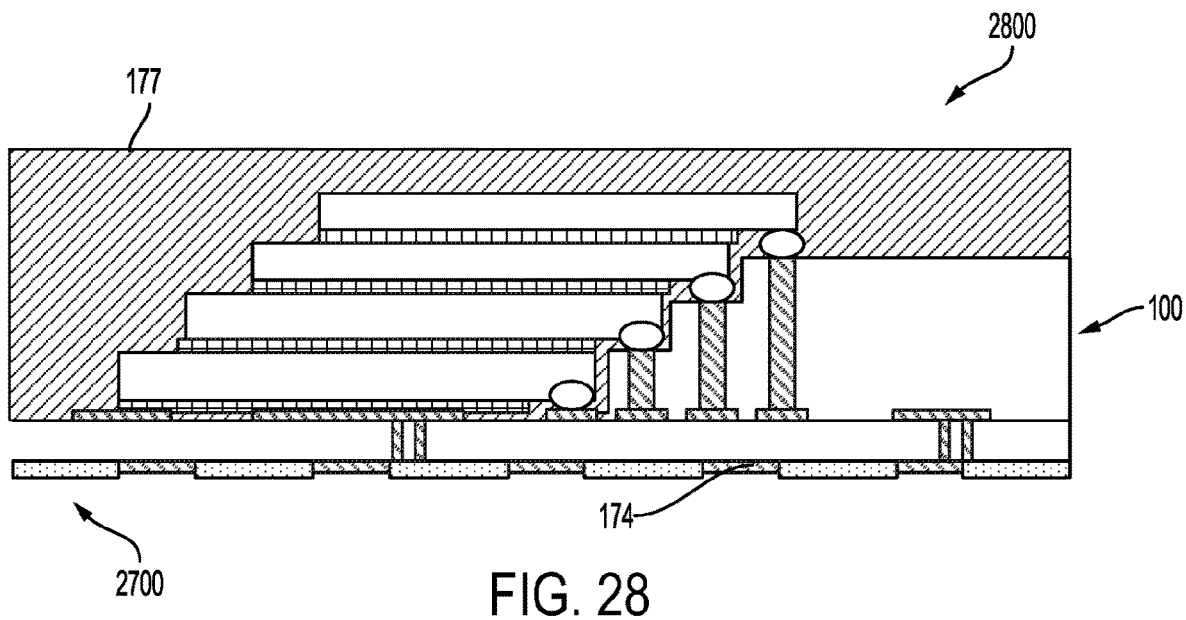

FIG. 28 illustrates an assembly 2800 subsequent to providing the mold material 177 around the dies 182-187 of the assembly 2700. In some embodiments, the mold material 177 may be provided by compression molding. In other embodiments, the mold material 177 may be provided by transfer molding (e.g., applications in which minimizing height is less of a concern). In some embodiments, no mold material 177 may be provided, and instead the dies 182-187 may be left "open." In some embodiments, no mold material 177 may be provided, and instead an underfill material may be provided for further mechanical stability. The assembly 2800 may include multiple solder pads 174, which may be surface finished.

Figure 29:
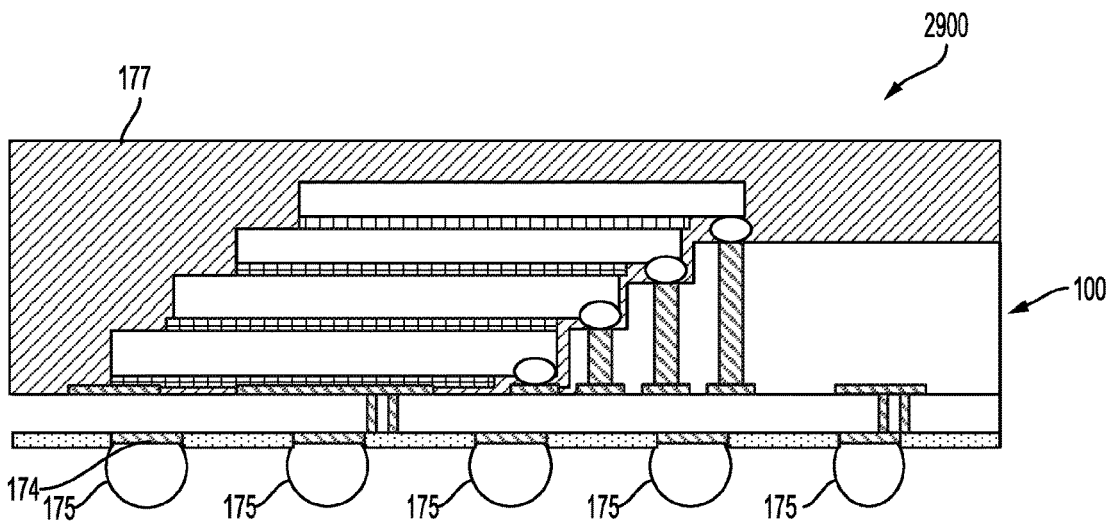

FIG. 29 illustrates an assembly 2900 subsequent to providing solder balls 175 to the solder pads 174 of the assembly 2800. In some embodiments, the solder balls 175 may be provided as part of a ball attach reflow and deflux (BARD) procedure, as known in the art. In some embodiments where multiple assemblies 2900 are formed in a continuous array, the assembly 2900 may be singulated from its neighbors (e.g., held in place with a vacuum fixture while a saw cuts the assembly 2900 from its neighbors). The assembly 2900 may form a package that can then be coupled to any other devices system via the solder balls 175.

Although the operations discussed with reference to FIGS. 7-29 were illustrated as forming particular package substrate structures, this is simply for illustrative purposes, and the operations and techniques discussed with reference to FIGS. 7-29 utilized to form any suitable package substrates (e.g., substrates having stairstep profiles, reciprocal symmetry, and/or approximate reciprocal symmetry).

Figure 30:
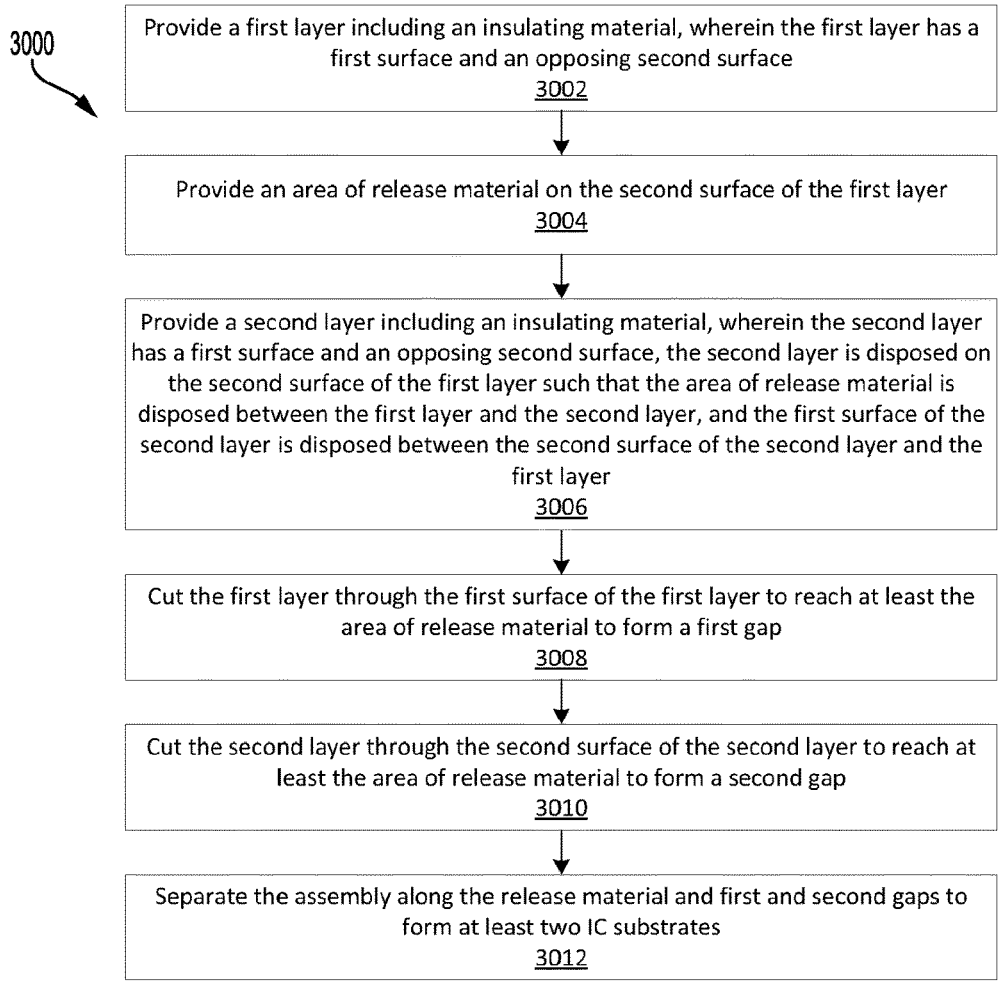
FIG. 30 is a flow diagram of a method of manufacturing a package substrate, in accordance with various embodiments.

FIG. 30 is a flow diagram of a method 3000 of manufacturing a package substrate, in accordance with various embodiments. An embodiment of this process may be used to form the assemblies discussed above with reference to FIGS. 7-25. While the operations of the method 3000 are arranged in a particular order in FIG. 30 and illustrated once each, in various embodiments, one or more of the operations may be repeated, omitted, or performed out of order. Any of the operations of the method 3000 may be performed in accordance with any of the embodiments of the package substrates 100 described herein.

At 3002-3010, an assembly may be formed. In particular, at 3002, a first layer may be provided. The first layer may include an insulating material and may have a first surface and an opposing second surface. In one example, the first layer may be the first layer 702 of the assembly 700 (FIG. 7). In another example, the first layer may be the first layer 1302 of the assembly 1300 (FIG. 13).

At 3004, an area of release material may be provided on the second surface of the first layer. In one example, the area of release material may be the area of release material 802 of the assembly 800 (FIG. 8). In another example, the area of release material may be the area of release material 1404 of the assembly 1400 (FIG. 14).

At 3006, a second layer may be provided. The second layer may include an insulating material and may have a first surface and an opposing second surface. The second layer may be disposed on the second surface of the first layer such that the area of release material is disposed between the first layer and the second layer, and such that the first surface of the second layer is disposed between the second surface of the second layer and the first layer. In one example, the second layer may be the second layer 902 of the assembly 900 (FIG. 9). In another example, the second layer may be the second layer 1502 of the assembly 1500 (FIG. 15).

At 3008, the first layer may be cut through the first surface of the first layer to reach at least the area of release material to form a first gap. In one example, the first gap may be the gap 1002 of the assembly 1000 (FIG. 10). In another example, the first gap may be the gap 1602 of the assembly 1600 (FIG. 16).

At 3010, the second layer may be cut through the second surface of the second layer to reach at least the area of release material to form a second gap. In one example, the second gap may be the gap 1102 of the assembly 1100 (FIG. 11). In another example, the second gap may be the gap 1904 of the assembly 1900 (FIG. 19).

At 3012, the assembly formed by 3002-3010 may be separated along the release material and first and second gaps to form at least two package substrates. In one example, the at least two package substrates may be the at least two package substrates 100 of the assembly 1200 (FIG. 12). In another example, the at least two package substrates may be the at least two package substrates 100 of the assembly 2000 (FIG. 20).

In some embodiments, the method 3000 may include forming a conductive pathway between the surface of at least one of the package substrates (formed at 3012) and a metal layer within the at least one package substrate. In some embodiments, the method 3000 may include forming a BGA attachment surface on at least one of the package substrates (formed at 3012). These are simply examples, and the method 3000 may include any of the manufacturing operations discussed herein with reference to manufacturing the package substrate 100 (e.g., the operations discussed above with reference to FIGS. 7-25).

FIG. 31 is a flow diagram of a method 3100 of manufacturing an IC assembly, in accordance with various embodiments. An embodiment of this process may be used to form the assemblies discussed above with reference to FIGS. 26-29. While the operations of the method 3100 are arranged in a particular order in FIG. 31 and illustrated once each, in various embodiments, one or more of the operations may be repeated, omitted, or performed out of order. Any of the operations of the method 3100 may be performed in accordance with any of the embodiments of the package substrates 100 described herein.

At 3102, a package substrate may be provided. The package substrate may include a first side face and a second side face opposite to the first side face along an axis. The package substrate may also include a portion of insulating material extending from the first side face to the second side face. A cross-section of the portion of insulating material, taken perpendicular to the axis, may have a stairstep profile and may include at least a base surface and a step surface. For example, the package substrate may be the package substrate 100 of any of FIGS. 4, 5, and 27, or any of the package substrates 100A and 100B of FIG. 6.

At 3104, a first die may be coupled to the base surface. For example, the first die may be the die 182 of any of FIGS. 4-6 and 27, or the die 193 of FIG. 6. Additionally, as noted above, any suitable surface may be identified as the "base surface."

At 3106, a second die may be coupled to the step surface. For example, the second die may be any of the dies 184 or 186 of FIGS. 4-6 and 27, the die 187 of FIG. 27, or any of the dies 195 or 197 of FIG. 6.

The package substrates and manufacturing techniques disclosed herein may be used to implement any suitable computing device. FIG. 32 is a block diagram of an example computing device 3200 that may include or be included in an IC assembly having a stairstep and/or reciprocally symmetric substrate (e.g., the package substrate 100). For example, the computing device 3200 may be at least partially implemented in an IC assembly including a package substrate with a stairstep profile.

As shown, the computing device 3200 may include one or more processors 3202 (e.g., one or more processor cores implemented on one or more dies) and a system memory 3204 (implemented on one or more dies). As used herein, the term "processor" or "processing device" may refer to any device or portion of a device that processes electronic data from registers and/or memory to transform that electronic data into other electronic data that may be stored in registers and/or memory. The processor(s) 3202 may include one or more microprocessors, graphics processors, digital signal processors, crypto processors, or other suitable devices. More generally, the computing device 3200 may include any suitable computational circuitry, such as one or more Application Specific Integrated Circuits (ASICs).

The computing device 3200 may include one or more mass storage devices 3206 (such as flash memory devices or any other suitable mass storage device). The system memory 3204 and the mass storage device 3206 may include any suitable storage devices, such as volatile memory (e.g., dynamic random access memory (DRAM)), nonvolatile memory (e.g., read-only memory (ROM)), and flash memory. The computing device 3200 may include one or more I/O devices 3208 (such as display, user input device, network interface cards, modems, and so forth). The elements may be coupled to each other via a system bus 3212, which represents one or more buses.

Each of these elements may perform its conventional functions known in the art. In particular, the system memory 3204 and the mass storage device 3206 may be employed to store a working copy and a permanent copy of programming instructions 3222. The permanent copy of the programming instructions 3222 may be placed into permanent mass storage devices 3206 in the factory or through a communication device included in the I/O devices 3208 (e.g., from a distribution server (not shown)). The constitution of elements 3202-3212 are known, and accordingly will not be further described.

The following paragraphs describe examples of various ones of the embodiments disclosed herein.

Example 1 is a package substrate, including: a first side face; a second side face, wherein the second side face is opposite to the first side face along an axis; a portion of insulating material extending from the first side face to the second side face, wherein a cross-section of the portion of insulating material taken perpendicular to the axis has a stair-step profile; a solder pad disposed at a base surface of the portion of insulating material; and a solder pad disposed at a step surface of the portion of insulating material.

Example 2 may include the subject matter of Example 1, and may further specify that conductive pathways extend between the respective solder pads and a metal layer.

Example 3 may include the subject matter of Example 2, and may further specify that the conductive pathways include pillars, plated through-holes, or vias.

Example 4 may include the subject matter of Example 2, and may further specify that the metal layer is a same metal layer for each of the one or more conductive pathways.

Example 5 may include the subject matter of Example 1, and may further specify that the axis is a first axis, the portion of insulating material is disposed at a third side face of the package substrate, a base surface of the portion of insulating material extends to a fourth side face of the package substrate, and the fourth side face is opposite to the third side face along a second axis perpendicular to the first axis.

Example 6 may include the subject matter of any of Examples 1-5, and may further specify that a depth of a base surface of the portion of insulating material is equal to a depth of a top step surface of the portion of insulating material.

Example 7 may include the subject matter of any of Examples 1-5, and may further specify that a depth of a base surface of the portion of insulating material is not equal to a depth of a top step surface of the portion of insulating material.

Example 8 may include the subject matter of any of Examples 1-5, and may further specify that the portion of insulating material has a base surface, a top step surface, and a plurality of intermediate step surfaces, and wherein depths of the plurality of intermediate step surfaces are equal.

Example 9 may include the subject matter of any of Examples 1-5, and may further specify that no metal layer is disposed between a top step surface of the portion of insulating material and a plane that includes a base surface of the portion of insulating material.

Example 10 may include the subject matter of Example 9, and may further specify that the base surface includes a metal layer.

Example 11 may include the subject matter of any of Examples 1-5, and may further specify that the package substrate has reciprocal symmetry.

Example 12 may include the subject matter of any of Examples 1-5, and may further specify that the package substrate has approximate reciprocal symmetry.

Example 13 may include the subject matter of any of Examples 1-5, and may further include a ball grid array (BGA) attachment surface.

Example 14 is an integrated circuit (IC) assembly, including: a substrate, including a first side face of the substrate, a second side face of the substrate, and may further specify that the second side face is opposite to the first side face along an axis, a portion of insulating material extending from the first side face to the second side face, wherein a cross-section of the portion of insulating material taken perpendicular to the axis has a stairstep profile and includes at least a base surface and a step surface; a first die electrically coupled to the base surface by a conductive pathway disposed between the first die and the base surface; and a second die electrically coupled to the step surface by a conductive pathway disposed between the second die and the step surface.

Example 15 may include the subject matter of Example 14, and may further specify that the second die extends over the first die such that the first die is at least partially disposed between the second die and the base surface.

Example 16 may include the subject matter of Example 15, and may further specify that the step surface is a first step surface, the portion of insulating material includes a second step surface, and the IC assembly includes a third die electrically coupled to the second step surface by a conductive pathway disposed between the third die and the second step surface.

Example 17 may include the subject matter of Example 16, and may further specify that the third die extends over the second die such that the second die is at least partially disposed between the third die and the first step surface.

Example 18 may include the subject matter of Example 14, and may further include a third die electrically coupled to the substrate via wire bonding and positioned such that the second die is disposed between the third die and the substrate.

Example 19 may include the subject matter of Example 18, and may further specify that the third die is electrically coupled to a top step surface of the substrate via wire bonding.

Example 20 may include the subject matter of Example 18, and may further specify that the IC assembly further includes a fourth die electrically coupled to the third die via wire bonding and positioned such that the third die is disposed between the fourth die and the substrate.

Example 21 may include the subject matter of Example 14, and may further specify that: the substrate is a first substrate; the IC assembly further includes a second substrate electrically coupled to the first substrate, wherein the second substrate includes a first side face of the second substrate, a second side face of the second substrate, wherein the second side face of the second substrate is opposite to the first side face of the second substrate along the axis, a second portion of insulating material extending from the first side face of the second substrate to the second side face of the second substrate, wherein a cross-section of the second portion of insulating material taken perpendicular to the axis has a stair-step profile and includes at least a second base surface and a second step surface; a third die electrically coupled to the second base surface by a conductive pathway disposed between the third die and the second base surface; and a fourth die electrically coupled to the second step surface by a conductive pathway disposed between the fourth die and the second step surface.

Example 22 may include the subject matter of Example 21, and may further specify that the second substrate is electrically coupled to a top step surface of the first substrate.

Example 23 may include the subject matter of any of Examples 14-17, and may further specify that the conductive pathway coupling the first die to the base surface includes solder and a solder pad.

Example 24 may include the subject matter of any of Examples 14-17, and may further specify that a die attach film or paste is disposed between the first die and the second die.

Example 25 may include the subject matter of any of Examples 14-17, and may further include conductive pathways disposed between the base surface and a ball grid array (BGA) attachment surface.

Example 26 may include the subject matter of any of Examples 14-17, and may further specify that the first die and the second die are flip chip dies.

Example 27 may include the subject matter of any of Examples 14-17, and may further specify that the substrate has reciprocal symmetry or approximate reciprocal symmetry.

Example 28 is a method of manufacturing a package substrate, including: forming an assembly by providing a first layer including an insulating material, wherein the first layer has a first surface and an opposing second surface, providing an area of release material on the second surface of the first layer, providing a second layer including an insulating material, wherein the second layer has a first surface and an opposing second surface, the second layer is disposed on the second surface of the first layer such that the area of release material is disposed between the first layer and the second layer, and the first surface of the second layer is disposed between the second surface of the second layer and the first layer, cutting the first layer through the first surface of the first layer to reach at least the area of release material to form a first gap, cutting the second layer through the second surface of the second layer to reach at least the area of release material to form a second gap; and separating the assembly along the release material and first and second gaps to form at least two package substrates.

Example 29 may include the subject matter of Example 28, and may further specify that the area of release material is a first area of release material, and wherein forming the assembly further includes: filling the first gap with release material; providing a second area of release material on the first surface of the first layer; providing a third layer including an insulating material, wherein the third layer has a first surface and an opposing second surface, the third layer is disposed on the first surface of the first layer such that the second area of release material is disposed between the first layer and the third layer, and the second surface of the third layer is disposed between the first surface of the third layer and the first layer; cutting the third layer through the first surface of the third layer to reach at least the second area of release material to form a third gap.

Example 30 may include the subject matter of Example 29, and may further include forming a conductive pathway between a surface of at least one of the package substrates and a metal layer within the at least one package substrate.

Example 31 may include the subject matter of Example 28, and may further include forming a ball grid array (BGA) attachment surface on at least one of the package substrates.

Example 32 may include the subject matter of Example 28, and may further specify that the two package substrates are identical.

Example 33 may include the subject matter of Example 28, and may further specify that at least one of the package substrates includes: a first side face; a second side face, wherein the second side face is opposite to the first side face along an axis; a portion of insulating material extending from the first side face to the second side face; wherein a cross-section of the portion of insulating material taken anywhere along the axis from the first side face to the second side face has a stairstep profile.

Example 34 may include the subject matter of Example 28, and may further specify that: the area of release material is a first area of release material; forming the assembly further includes providing a second area of release material on the first surface of the first layer and providing a third layer including an electrically insulating material, wherein the third layer has a first surface and an opposing second surface, the third layer is disposed on the first surface of the first layer such that the second area of release material is disposed between the first layer and the third layer, and the second surface of the third layer is disposed between the first surface of the third layer and the first layer; cutting the first layer through the first surface of the first layer to reach at least the area of release material to form a first gap includes cutting the first layer and the second layer to reach at least the second area of release material to form the first gap; and forming the assembly further includes cutting the third layer and the first layer to reach at least the first area of release material to form the second gap.

Example 35 may include the subject matter of Example 34, and may further specify that forming the assembly further includes forming a conductive pathway between the second layer and the third layer.

Example 36 may include the subject matter of Example 35, and may further include surface-finishing a surface of the conductive pathway after separating the assembly along the release material and first and second gaps to form the at least two package substrates.

Example 37 may include the subject matter of Example 34, and may further include removing insulating material from at least one of the package substrates by routing.

Example 38 may include the subject matter of Example 28, and may further specify that forming the assembly further includes: prior to cutting the second layer from the second surface of the second layer to reach at least the area of release material to form the second gap, providing a stabilizing layer to the first surface of the first layer; and after filling the second gap with release material, removing the stabilizing layer.

Example 39 may include the subject matter of Example 38, and may further specify that the stabilizing layer includes a tape.

Example 40 may include the subject matter of Example 28, and may further specify that the first layer includes a core of electrically insulating material, a layer of conductive material at the first surface of the first layer, and a layer of conductive material at the second surface of the first layer.

Example 41 may include the subject matter of any of Examples 28-40, and may further specify that the release material includes a fluorocarbon polymer or a fluoropolymer or a siloxane.

Example 42 may include the subject matter of any of Examples 28-40, and may further specify that cutting the first layer through the first surface of the first layer to form the first gap includes laser cutting, sawing, or mechanical routing.

Example 43 is a method of manufacturing an integrated circuit (IC) assembly, including: providing a package substrate, including a first side face of the package substrate, a second side face of the package substrate, wherein the second side face is opposite to the first side face along an axis, a portion of insulating material extending from the first side face to the second side face, wherein a cross-section of the portion of insulating material taken perpendicular to the axis has a stairstep profile and includes at least a base surface and a step surface; coupling a first die to the base surface; and coupling a second die to the step surface.

Example 44 may include the subject matter of Example 43, and may further specify that coupling the first die to the base surface includes electrically coupling the first die to the base surface by a conductive pathway disposed between the first die and the base surface.

Example 45 may include the subject matter of Example 43, and may further specify that coupling the second die to the step surface includes positioning the second die such that the first die is at least partially disposed between the second die and the base surface.

Example 46 may include the subject matter of Example 43, and may further include electrically coupling a third die to the package substrate; wherein the second die is at least partially disposed between the third die and the package substrate.

Example 47 may include the subject matter of Example 46, and may further specify that electrically coupling the third die to the package substrate includes coupling a second package substrate to the first package substrate, wherein the third die is coupled to the second package substrate.

Example 48 may include the subject matter of Example 46, and may further specify that electrically coupling the third die to the package substrate includes wire-bonding the third die to the step surface of the package substrate.

Example 49 may include the subject matter of any of Examples 43-48, and may further include, prior to coupling the first die to the base surface, plasma cleaning the base surface.

Example 50 may include the subject matter of any of Examples 43-48, and may further include, after coupling the first die to the base surface and the second die to the step surface, providing a mold material around the first die and the second die.

Example 51 may include the subject matter of any of Examples 43-48, and may further include, after coupling the first die to the base surface and the second die to the step surface, providing an underfill material between the first die and the base surface.

Example 52 is a package substrate, including: a first side face; a second side face, wherein the second side face is opposite to the first side face along an axis; a portion of insulating material extending from the first side face to the second side face; wherein a cross-section of the portion of insulating material taken perpendicular to the axis has a stair-step profile.

Example 53 may include the subject matter of Example 52, and may further specify that the portion of insulating material includes one or more step surfaces, and wherein one or more conductive pathways extend between the respective one or more step surfaces and a metal layer.

Example 54 may include the subject matter of Example 53, and may further specify that the one or more conductive pathways include pillars, plated through-holes, or vias.

Example 55 may include the subject matter of Example 53, and may further specify that the metal layer is a same metal layer for each of the one or more conductive pathways.

Example 56 may include the subject matter of Example 52, and may further specify that the axis is a first axis, the portion of insulating material is disposed at a third side face of the package substrate, a base surface of the portion of insulating material extends to a fourth side face of the package substrate, and the fourth side face is opposite to the third side face along a second axis perpendicular to the first axis.

Example 57 may include the subject matter of any of Examples 52-56, and may further specify that a depth of a base surface of the portion of insulating material is equal to a depth of a top step surface of the portion of insulating material.

Example 58 may include the subject matter of any of Examples 52-56, and may further specify that a depth of a base surface of the portion of insulating material is not equal to a depth of a top step surface of the portion of insulating material.

Example 59 may include the subject matter of any of Examples 52-56, and may further specify that the portion of insulating material has a base surface, a top step surface, and a plurality of intermediate step surfaces, and wherein depths of the plurality of intermediate step surfaces are equal.

Example 60 may include the subject matter of any of Examples 52-56, and may further specify that no metal layer is disposed between a top step surface of the portion of insulating material and a plane that includes a base surface of the portion of insulating material.

Example 61 may include the subject matter of Example 60, and may further specify that the base surface includes a metal layer.

Example 62 may include the subject matter of any of Examples 52-56, and may further specify that the package substrate has reciprocal symmetry.

Example 63 may include the subject matter of any of Examples 52-56, and may further specify that the package substrate has approximate reciprocal symmetry.

Example 64 may include the subject matter of any of Examples 52-56, and may further include a ball grid array (BGA) attachment surface.

What is claimed is:
1. A package substrate, comprising:
a first side face;
a second side face, wherein the second side face is opposite to the first side face along an axis;

a portion of insulating material extending from the first side face to the second side face, wherein a cross-section of the portion of insulating material taken perpendicular to the axis has a stair-step profile;

a solder pad disposed at a base surface of the portion of insulating material; and a solder pad disposed at a step surface of the portion of insulating material, wherein conductive pathways extend between the respective solder pads and a metal layer.

2. The package substrate of claim 1, wherein the conductive pathways includes pillars, plated through-holes, or vias.

3. The package substrate of claim 1, wherein the axis is a first axis, the portion of insulating material is disposed at a third side face of the package substrate, a base surface of the portion of insulating material extends to a fourth side face of the package substrate, and the fourth side face is opposite to the third side face along a second axis perpendicular to the first axis.

4. The package substrate of claim 1, wherein no metal layer is disposed between a top step surface of the portion of insulating material and a plane that includes a base surface of the portion of insulating material.

5. The package substrate of claim 4, wherein the base surface includes a metal layer.

6. The package substrate of claim 1, wherein the package substrate has reciprocal symmetry.

7. An integrated circuit (IC) assembly, comprising:
a substrate, including:
a first side face of the substrate,
a second side face of the substrate, wherein the second side face is opposite to the first side face along an axis,
a portion of insulating material extending from the first side face to the second side face,
wherein a cross-section of the portion of insulating material taken perpendicular to the axis has a stairstep profile and includes at least a base surface and a step surface;
a first die electrically coupled to the base surface by a conductive pathway disposed between the first die and the base surface;
a second die electrically coupled to the step surface by a conductive pathway disposed between the second die and the step surface; and
a third die electrically coupled to the substrate via wire bonding and positioned such that the second die is disposed between the third die and the substrate.

8. The IC assembly of claim 7, wherein the second die extends over the first die such that the first die is at least partially disposed between the second die and the base surface.

9. The IC assembly of claim 8, wherein the step surface is a first step surface, the portion of insulating material includes a second step surface, and the IC assembly includes a third die electrically coupled to the second step surface by a conductive pathway disposed between the third die and the second step surface.

10. The IC assembly of claim 9, wherein the third die extends over the second die such that the second die is at least partially disposed between the third die and the first step surface.

11. The IC assembly of claim 7, wherein the third die is electrically coupled to a top step surface of the substrate via wire bonding.

12. The IC assembly of claim 7, wherein the IC assembly further includes a fourth die electrically coupled to the third die via wire bonding and positioned such that the third die is disposed between the fourth die and the substrate.

13. The IC assembly of claim 7, wherein:
the substrate is a first substrate;
the IC assembly further includes a second substrate electrically coupled to the first substrate, wherein the second substrate includes:
a first side face of the second substrate,
a second side face of the second substrate, wherein the second side face of the second substrate is opposite to the first side face of the second substrate along the axis,
a second portion of insulating material extending from the first side face of the second substrate to the second side face of the second substrate,
wherein a cross-section of the second portion of insulating material taken perpendicular to the axis has a stair-step profile and includes at least a second base surface and a second step surface;
a third die electrically coupled to the second base surface by a conductive pathway disposed between the third die and the second base surface; and
a fourth die electrically coupled to the second step surface by a conductive pathway disposed between the fourth die and the second step surface.

14. The IC assembly of claim 13, wherein the second substrate is electrically coupled to a top step surface of the first substrate.

15. The IC assembly of claim 7, further comprising conductive pathways disposed between the base surface and a ball grid array (BGA) attachment surface.

16. The package substrate of claim 1, wherein the portion of insulating material has a top step surface and a plurality of intermediate step surfaces, and wherein depths of the plurality of intermediate step surfaces are equal.

17. A package substrate, comprising:
a first side face;
a second side face, wherein the second side face is opposite to the first side face along a first axis;
a portion of insulating material at a third side face of the package substrate and extending from the first side face to the second side face, wherein a cross-section of the portion of insulating material taken perpendicular to the axis has a stair-step profile;
a solder pad disposed at a base surface of the portion of insulating material, wherein the base surface of the portion of insulating material extends to a fourth side face of the package substrate, and the fourth side face is opposite to the third side face along a second axis perpendicular to the first axis; and
a solder pad disposed at a step surface of the portion of insulating material.

18. The package substrate of claim 17, wherein no metal layer is disposed between a top step surface of the portion of insulating material and a plane that includes the base surface of the portion of insulating material.

19. The package substrate of claim 18, wherein the base surface includes a metal layer.

20. The package substrate of claim 17, wherein the package substrate has reciprocal symmetry.

21. The package substrate of claim 1, wherein the portion of insulating material has a top step surface and a plurality of intermediate step surfaces, and wherein depths of the plurality of intermediate step surfaces are equal.

22. An integrated circuit (IC) assembly, comprising:
a first substrate, including:
a first side face of the first substrate, a second side face of the first substrate, wherein the second side face of the first substrate is opposite to the first side face of the first substrate along an axis, a first portion of insulating material extending from the first side face of the first substrate to the second side face of the first substrate, wherein a cross-section of the first portion of insulating material taken perpendicular to the axis has a stairstep profile and includes at least a first base surface and a first step surface;

a first die electrically coupled to the first base surface by a conductive pathway disposed between the first die and the first base surface;

a second die electrically coupled to the first step surface by a conductive pathway disposed between the second die and the first step surface;

a second substrate electrically coupled to the first substrate, wherein the second substrate includes:

a first side face of the second substrate, a second side face of the second substrate, wherein the second side face of the second substrate is opposite to the first side face of the second substrate along the axis, a second portion of insulating material extending from the first side face of the second substrate to the second side face of the second substrate, wherein a cross-section of the second portion of insulating material taken perpendicular to the axis has a stair-step profile and includes at least a second base surface and a second step surface;

a third die electrically coupled to the second base surface by a conductive pathway disposed between the third die and the second base surface; and a fourth die electrically coupled to the second step surface by a conductive pathway disposed between the fourth die and the second step surface.

23. The IC assembly of claim 22, wherein the second substrate is electrically coupled to a top step surface of the first substrate.

24. The IC assembly of claim 22, wherein the conductive pathway coupling the first die to the base surface includes solder and a solder pad.

25. The IC assembly of claim 22, wherein a die attach film or paste is disposed between the first die and the second die.

* * * * *

UNITED STATES PATENT AND TRADEMARK OFFICE
CERTIFICATE OF CORRECTION

PATENT NO. : 10,748,873 B2
APPLICATION NO. : 15/755219
DATED : August 18, 2020
INVENTOR(S) : Mao Guo et al.

Page 1 of 1

It is certified that error appears in the above-identified patent and that said Letters Patent is hereby corrected as shown below:

On the Title Page

Item (54), Line 1 of the title, delete "ASSEMBLES" and insert -- ASSEMBLIES --.

In the Specification

In Column 1, Line 1 of the title, delete "ASSEMBLES" and insert -- ASSEMBLIES --.

Signed and Sealed this
Twenty-fifth Day of May, 2021

Drew Hirshfeld
*Performing the Functions and Duties of the
Under Secretary of Commerce for Intellectual Property and
Director of the United States Patent and Trademark Office*